(12) United States Patent
Tsuji et al.

(10) Patent No.: US 8,551,853 B2
(45) Date of Patent: Oct. 8, 2013

(54) NON-VOLATILE SEMICONDUCTOR MEMORY DEVICE AND MANUFACTURING METHOD THEREOF

(75) Inventors: Kiyotaka Tsuji, Osaka (JP); Takumi Mikawa, Shiga (JP); Kenji Tominaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 50 days.

(21) Appl. No.: 13/498,541

(22) PCT Filed: Jul. 7, 2011

(86) PCT No.: PCT/JP2011/003902
§ 371 (c)(1),
(2), (4) Date: Mar. 27, 2012

(87) PCT Pub. No.: WO2012/005003
PCT Pub. Date: Dec. 1, 2012

(65) Prior Publication Data
US 2012/0181500 A1    Jul. 19, 2012

(30) Foreign Application Priority Data
Jul. 8, 2010 (JP) .................................. 2010-155635

(51) Int. Cl.
*H01L 21/20* (2006.01)
(52) U.S. Cl.
USPC .. 438/382; 257/4; 257/E47.001; 257/E21.004
(58) Field of Classification Search
USPC ............................................. 257/4; 438/382
See application file for complete search history.

(56) References Cited

U.S. PATENT DOCUMENTS

| 6,753,561 B1 | 6/2004 | Chevallier et al. |
| 2003/0235070 A1 | 12/2003 | Ooishi |

(Continued)

FOREIGN PATENT DOCUMENTS

| JP | 09-306914 A | 11/1997 |
| JP | 2001-185691 A | 7/2001 |

OTHER PUBLICATIONS

O'Sullivan, "Electroless Deposition," Electrochemistry Encyclopedia, (http://electrochem.cwru.edu/encycl/), Feb. 2011.*
International Search Report issued in International Patent Application No. PCT/JP2011/003902, dated Oct. 4, 2011.

*Primary Examiner* — Cheung Lee
*Assistant Examiner* — Christopher Johnson
(74) *Attorney, Agent, or Firm* — McDermott Will & Emery LLP

(57) ABSTRACT

A non-volatile semiconductor memory device comprises a plurality of memory cell holes (101) formed through an interlayer insulating layer (80) at respective cross-points of a plurality of first wires (10) of a stripe shape and a plurality of second wires (20) of a stripe shape when viewed from above such that the memory cell holes (101) expose upper surfaces of the plurality of first wires, respectively, a plurality of dummy holes (111) formed on the plurality of first wires in the interlayer insulating layer such that the dummy holes reach the upper surfaces of the plurality of first wires, respectively, and stacked-layer structures formed inside the memory cell holes and inside the dummy holes, respectively, each of the stacked-layer structures including a first electrode (30) and a variable resistance layer (40); an area of a portion of the first wire which is exposed in a lower opening of one of the dummy holes being greater than an area of a portion of the first wire which is exposed in a lower opening of one of the memory cell holes; and one or more of the dummy holes being formed on each of the first wires.

15 Claims, 19 Drawing Sheets

(56) References Cited

U.S. PATENT DOCUMENTS

| | | |
|---|---|---|
| 2004/0245557 A1 | 12/2004 | Seo et al. |
| 2005/0237791 A1 | 10/2005 | Motoyoshi |
| 2006/0002216 A1 | 1/2006 | Ooishi |
| 2007/0114587 A1 | 5/2007 | Seo et al. |
| 2011/0069531 A1 | 3/2011 | Aburada et al. |
| 2011/0220861 A1 | 9/2011 | Himeno et al. |

* cited by examiner

NON-VOLATILE SEMICONDUCTOR MEMORY DEVICE AND MANUFACTURING METHOD THEREOF

RELATED APPLICATIONS

This application is the U.S. National Phase under 35 U.S.C. §371 of International Application No. PCT/JP2011/003902, filed on Jul. 7, 2011, which in turn claims the benefit of Japanese Application No. 2010-155635, filed on Jul. 8, 2010, the disclosures of which Applications are incorporated by reference herein.

TECHNICAL FIELD

The present invention relates to a cross-point non-volatile semiconductor memory device including a variable resistance layer. Particularly, the present invention relates to a non-volatile semiconductor memory device having a structure suitable for a miniaturized configuration.

BACKGROUND ART

With recent progresses of digital technologies, electronic devices such as portable information devices and information home appliances have been developed to provide enhanced functionalities. Because of this, there have been increasing demands for an increased capacity of a non-volatile memory device, a reduced write electric power in the non-volatile memory device, a reduced write/read time in the non-volatile memory device, and longer life of the non-volatile memory device.

Under the circumstances in which there are such demands, miniaturization of the existing flash memory using a floating gate has been progressing.

In the case of a non-volatile semiconductor memory element (resistance variable memory, hereinafter referred to as ReRAM) including as a memory section a variable resistance element which changes its resistance values retained stably, by application of voltage pulses, a memory cell can be implemented with a simple structure. Therefore, further miniaturization, a higher-speed, and lower electric power consumption of the non-volatile semiconductor memory element are expected.

As a variable resistance layer, there are proposed a nickel oxide layer (NiO), a vanadium oxide layer ($V_2O_5$), a zinc oxide layer (ZnO), a niobium oxide layer ($Nb_2O_5$), a titanium oxide layer ($TiO_2$), a tungsten oxide layer ($WO_3$), a cobalt oxide layer (CoO), etc. (see Patent Literature 1). It is known that each of these transition metal oxide layers exhibits specific resistance values when voltages or currents which are equal to or greater than thresholds are applied thereto and retain the specific resistance values until voltages or currents are newly applied thereto. These transition metal oxide layers have a feature that they can be manufactured using the existing semiconductor manufacturing process steps substantially without modifying them.

There has been proposed a cross-point memory array having a configuration in which memory cell arrays are stacked together on a conventional CMOS circuit (see Patent Literature 2).

CITATION LISTS

Patent Literature

Patent Literature 1: Japanese Laid-Open Patent Application Publication No. 2004-363604
Patent Literature 2: U.S. Pat. No. 6,753,561 Specification

SUMMARY OF THE INVENTION

Technical Problem

As shown in FIG. 20, a cross-point memory cell disclosed in Patent Literature 2 has a configuration, in which a memory plug having a multi-layer structure is sandwiched between two conductive lines 210 and 215 crossing each other. The memory plug includes a variable resistance element including a CMOS memory layer 225, and two electrodes 220 and 230 sandwiching the CMOS memory layer 225, and an MIM diode including an insulating layer 240 and two metal layers 235 and 245 sandwiching the insulating layer 240. As shown in FIG. 20, the memory plug has a multiple-layer structure in which multiple layers are stacked together. In a manufacturing method of the memory plug, individual layers are stacked over the entire surface, and then the memory plug is formed by etching. There exists a problem that in a miniaturized memory plug, an area of a photoresist protecting a memory plug region during etching, which contacts a surface of the multiple-layer structure, decreases and its adhesivity decreases, so that the memory plug cannot be patterned stably.

Instead of forming the memory plug by etching the multi-layer structure, as stated above, there is a method in which a memory cell is filled into a memory cell hole (also referred to as a contact hole) formed through an interlayer insulating layer. In this case, it is difficult to form the entire of the above stated multi-layer structure inside a miniaturized memory cell hole.

In view of the problem mentioned above, an object of the present invention is to form memory cells each having a multi-layer structure inside memory cell holes such that the memory cells have more uniform characteristics.

Solution to Problem

The inventors presumed that a memory cell having a multi-layer structure can be formed inside a miniaturized memory cell hole, by using electroless selective growth plating, and intensively studied a specific method for implementing this. As a result, the inventors discovered the following findings.

For example, an interlayer insulating layer comprising $SiO_2$ is formed on a metal wire, and a memory cell hole is formed through the interlayer insulating layer such that the metal wire is exposed. If an electrode material, to be precise, a material which will become an electrode of a variable resistance element, is deposited on the metal wire using a deposition method such as sputtering, the electrode material is also deposited on the interlayer insulating layer. The electrode material on the interlayer insulating layer must be removed by CMP or the like. However, when platinum or the like is used as the electrode material, it is sometimes difficult to remove the electrode material by CMP. In contrast, by using the electroless selective growth plating, the electrode material can be deposited only on the wire comprising metal, without depositing the electrode material on the interlayer insulating layer comprising $SiO_2$.

However, it has been found out that, when the electrode material is actually deposited into the memory cell hole, by the electroless selective growth plating, significant non-uniformity occurs in thicknesses of the deposited electrode layers. In addition, it has been found out that electrode layers formed on the same metal wire are substantially uniform in thickness, but in some occasions, electrode layers formed on different metal wires are significantly differed in thickness from each other.

It is presumed that this phenomenon is attributed to the following mechanism. In the electroless selective growth plating, a reaction proceeds by migration of electric charge between a component in a plating solution and a surface to be plated, without applying a current through the surface to be plated. Because of this, the plating is affected significantly by an electric potential of the surface to be plated. Since the same metal wire has a substantially equal electric potential, the plating is initiated at substantially the same timing and the resulting plated electrode layers have a substantially uniform thickness. On the other hand, when different metal wires have electric potentials different from each other, the plating is initiated on the respective metal wires at different timings, which results in non-uniformity in thicknesses of the plated electrode layers.

Due to the non-uniformity in the thicknesses of the electrode layers, for example, the following problems arise.

Firstly, initial resistances of variable resistance elements are lower as the electrode layers are thicker, even when variable resistance layers have a uniform thickness. This may be due to the fact that a degree of planarity of a precious metal electrode surface decreases due to an increase in a stress applied to the precious metal electrode. Due to a decrease in the degree of planarity of the precious metal electrode surface, an electric field is not applied to the variable resistance layers evenly, which adversely affects characteristics of the variable resistance elements. To be specific, for example, non-uniformity occurs in initial resistances, voltages and currents which cause resistance change, changing magnitudes of resistance values, etc., or reliability (retention, endurance) is lowered.

Secondarily, in the case where the variable resistance elements are formed inside the memory cell holes, the thicknesses of the variable resistance layers are smaller as the thicknesses of the electrode layers are greater. Even if an equal voltage is applied between word lines and bit lines, in a configuration in which the thicknesses of the variable resistance layers are differed from each other, electric field intensities applied to the variable resistance layers are differed from each other, thereby adversely affecting the characteristics of the variable resistance elements. To be specific, for example, non-uniformity occurs in voltages and currents which cause resistance change, changing magnitudes of resistance values, etc., or reliability (retention, endurance) is lowered.

Thirdly, in a case where the variable resistance layer has a two-layer structure in which a lower-resistance layer with a lower oxygen content is stacked on a higher-resistance layer with a higher oxygen content, a hole into which the higher-resistance layer is deposited becomes shallower as the electrode layer is thicker. As a result, the higher-resistance layer is deposited with a greater thickness regardless of the same deposition time, which affects the characteristics of the variable resistance elements. To be specific, for example, non-uniformity occurs in initial resistances, voltages and currents which cause resistance change, changing magnitudes of resistance values, etc., or reliability (retention, endurance) is lowered.

In the electroless selective growth plating, there is a tendency that plating is initiated more easily on metal having a greater exposed area, and is initiated less easily on metal having a smaller exposed area. Through an experiment, the inventors confirmed that the plating is initiated more easily when an exposed area of metal inside a memory cell hole is greater, in a case where an electrode material is deposited on a metal wire exposed inside the memory cell hole. In view of this result, the inventors conceived that the plating can be initiated on different metal wires at the same timing, by forming, on the same metal wire, a dummy hole (plating uniformity attaining hole) having an greater opening area, in addition to the memory cell hole, for each of the metal wires. This allows electrode layers deposited on the metal wires to have a uniform thickness. As a result, the performance of the elements is improved.

To achieve the above objective, a non-volatile semiconductor memory device of the present invention comprises a substrate; a plurality of first wires of a stripe shape which are formed on the substrate; an interlayer insulating layer formed to cover the plurality of first wires; a plurality of second wires of a stripe shape which are formed on the interlayer insulating layer such that the plurality of second wires are located above the plurality of first wires and cross the plurality of first wires, respectively; a plurality of memory cell holes formed at cross-points of the plurality of first wires and the plurality of second wires, respectively, when viewed from above, the plurality of memory cell holes being formed through the interlayer insulating layer between the plurality of first wires and the plurality of second wires such that the memory cell holes expose upper surfaces of the plurality of first wires, respectively; a plurality of dummy holes formed on the plurality of first wires, respectively in the interlayer insulating layer such that the plurality of dummy holes reach the upper surfaces of the first wires, respectively; and stacked-layer structures formed inside the memory cell holes and inside the dummy holes, respectively, each of the stacked-layer structures including a first electrode and a variable resistance layer formed on the first electrode; an area of a portion of the first wire which is exposed in a lower opening of one of the dummy holes being greater than an area of a portion of the first wire which is exposed in a lower opening of one of the memory cell holes; and one or more of the dummy holes being formed on each of the first wires.

A method of manufacturing a non-volatile semiconductor memory device, of the present invention, comprises a step (A) of forming a plurality of first wires of a stripe shape on a substrate; a step (B) of forming an interlayer insulating layer on the substrate including the plurality of first wires; a step (C) of forming, through the interlayer insulating layer, a plurality of memory cell holes and at least one dummy hole such that the memory cell holes and the dummy hole reach upper surfaces of the plurality of first wires, the dummy hole having a greater lower opening area than the memory cell holes; a step (D) of depositing a first electrode material on the plurality of first wires exposed in lower openings of the memory cell holes and a lower opening of the dummy hole, by electroless selective growth plating, to form first electrodes inside the memory holes, respectively; a step (E) of filling variable resistance layers inside the plurality of memory cell holes, respectively such that the variable resistance layers are located on the first electrodes, respectively; and a step (F) of forming a plurality of second wires of a stripe shape on the interlayer insulating layer and on the variable resistance layers filled inside the memory cell holes such that the plurality of second wires cross the plurality of first wires, respectively.

In accordance with this configuration, in the step of depositing lower electrodes by the electroless selective growth plating, deposition of the electrode material takes place preferentially in bottom (s) of the dummy hole(s) having a greater area and a lower aspect ratio (height of a hole/maximum dimension in a bottom of the hole), and deposition of the electrode material takes place all at once in bottoms of the memory cell holes which will be provided with the variable resistance elements, upon initiation of the deposition in the bottom(s) of the dummy hole(s). In this way, as compared to a configuration in which no dummy holes are provided, the deposition of the first electrode material takes place in portions of the variable resistance elements substantially at the same time. Therefore, all of the variable resistance elements are allowed to include first electrodes which are uniform in thickness. Even when the bottom areas of miniaturized memory cell holes provided with the variable resistance elements, are smaller, plating in the bottoms of the memory cell holes is initiated upon the initiation of the deposition in the bottom(s) of the dummy hole(s). As a result, it is possible to suppress an increase in a degree of non-uniformity in thicknesses of the first electrodes in a miniaturized configuration.

To prevent an increase in a layout area of the dummy hole in a planar layout, the dummy holes preferably have a rectangular shape when viewed from above, in which a short-side length of the rectangular shape is equal to or greater than a diameter of a shape of the variable resistance element when viewed from above, and is equal to or smaller than a width of the first wire under the dummy hole.

Furthermore, a part of the dummy hole may protrude outward from the first wire located under the dummy hole, when viewed from above. In this case, a side surface of the first wire is also exposed in the protruded portion of the dummy hole, in the step of forming the dummy hole by etching or the like. As a result, by using the dummy hole, uniformity in thicknesses of plated layers is achieved more effectively.

According to another aspect of the present invention, a non-volatile semiconductor memory device of the present invention comprises a substrate; a plurality of first wires of a stripe shape which are formed on the substrate; an interlayer insulating layer formed to cover the plurality of first wires; a plurality of second wires of a stripe shape which are formed on the interlayer insulating layer such that the plurality of second wires are located above the plurality of first wires and cross the plurality of first wires, respectively; a plurality of memory cell holes formed at cross-points of the plurality of first wires and the plurality of second wires, respectively, when viewed from above, the memory cell holes being formed through the interlayer insulating layer between the plurality of first wires and the plurality of second wires such that the memory cell holes expose upper surfaces of the plurality of first wires, respectively; a plurality of dummy holes formed on the plurality of first wires in the interlayer insulating layer such that the plurality of dummy holes reach the upper surfaces of the first wires, respectively; and stacked-layer structures formed inside the memory cell holes and inside the dummy holes, respectively, each of the stacked-layer structures including a first electrode and a variable resistance layer formed on the first electrode; an area of one of the dummy holes which contacts a corresponding one of the first wires in a bottom of the dummy hole being greater than an area of one of the memory cell holes which contacts a corresponding one of the first wires in a bottom surface of the first electrode, and one or more dummy holes being formed on each of the first wires.

According to another aspect of the present invention, a method of manufacturing a non-volatile semiconductor memory device, comprises a step (A) of forming a plurality of first wires of a stripe shape on a substrate; a step (B) of forming an interlayer insulating layer on the substrate including the plurality of first wires; a step (C) of forming, in the interlayer insulating layer, a plurality of contact holes and a plurality of plating uniformity attaining holes such that the contact holes and the plating uniformity attaining holes reach upper surfaces of the plurality of first wires, respectively; a step (D) of simultaneously depositing first electrodes on upper surfaces of the plurality of first wires exposed in bottoms of the contact holes and in bottoms of the plating uniformity attaining holes, respectively, by electroless selective growth plating; a step (E) of filling variable resistance layers into the plurality of contact holes and into the plurality of plating uniformity attaining holes, respectively such that the variable resistance layers are connected to the first electrodes, respectively; and a step (F) of forming a plurality of second wires of a stripe shape on the interlayer insulating layer and on the variable resistance layers filled into the contact holes and the plating uniformity attaining holes such that the plurality of second wires cross the plurality of first wires, respectively.

Advantageous Effects of the Invention

A non-volatile semiconductor memory device of the present invention has an advantage that by placing a dummy hole having a greater bottom area than a variable resistance element in addition to the variable resistance element, on the same lower wire of a memory cell array, it is possible to suppress non-uniformity in thicknesses of plated electrode layers in bottoms of memory cell holes, which are formed by electroless selective growth plating, and hence the resulting bit failure.

DESCRIPTION OF THE EMBODIMENTS

Hereinafter, embodiments of the present invention will be described with reference to Figures. The same components are designated by the same reference symbols and repetitive description will not be given in some cases.

In the present invention, according to a general interpretation, the wordings "formed on a substrate" mean a case where a constituent is formed directly on the substrate, and a case where constituent is formed on the substrate such that another constituent intervenes between them. The wordings "interlayer insulating layer" refer to both of an interlayer insulating layer formed through one process step in manufacturing process steps of a non-volatile memory element, and an interlayer insulating layer including a plurality of interlayer insulating layers formed through a plurality of process steps in the manufacturing process steps of the non-volatile memory element, and joined together to form a single layer. It should be noted that a shape of a variable resistance element, a shape of a plating uniformity attaining hole, a shape of wires, etc., are schematically drawn. A rectangular shape which is a shape of a memory cell hole when viewed from above includes a rectangular shape having a right-angle corner portion, and a rectangular shape having a rounded corner portion. Moreover, the number of these constituents, etc., is set for easier illustration.

Although a variable resistance element formed on a lower wire is exemplarily described regarding a single-layer cross-point memory array, in the specification, the cross-point memory array of the present invention is not limited to the single-layer cross-point memory array, but similar advantages can be achieved with regard to lower wires and variable resistance elements formed on them, respectively, in cross-point memory arrays stacked together in two or more layers.

Hereinafter, the embodiments of the present invention will be described. Prior to describing the embodiments, description will be given of a device configuration in a case where a plated layer is formed in a bottom inside a memory cell hole in a cross-point non-volatile semiconductor memory device, and a manufacturing method thereof.

Figure 13:
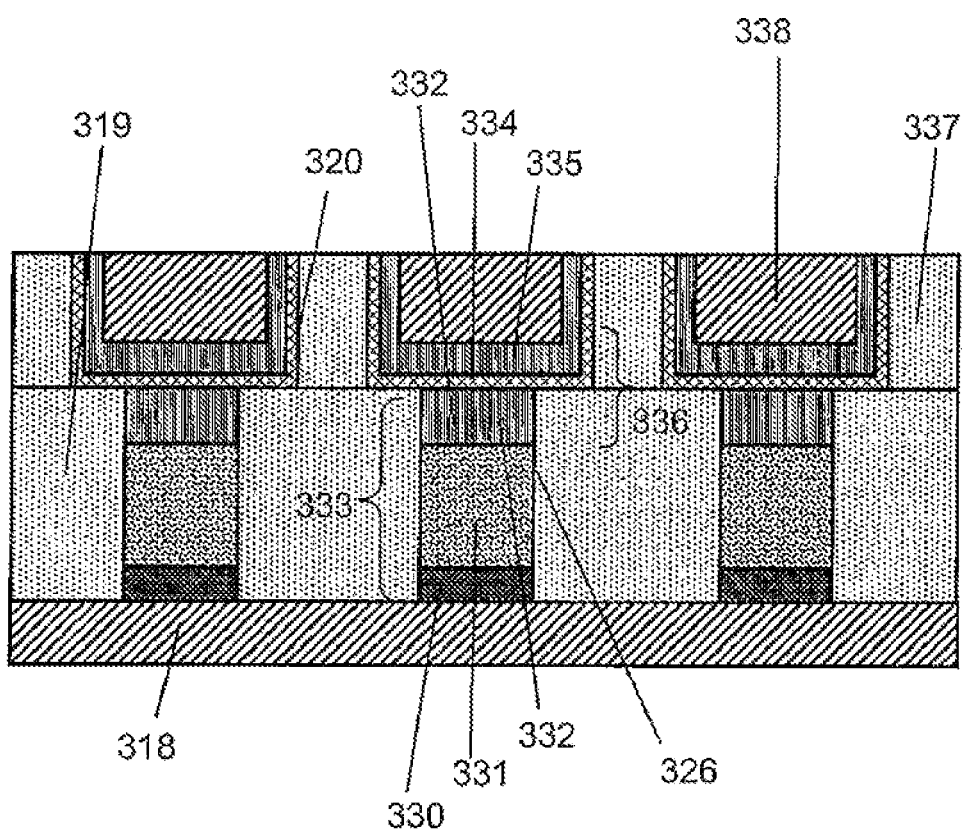
FIG. 13 is a cross-sectional view showing a configuration of a memory section of a cross-point non-volatile semiconductor memory device.

FIG. 13 is a cross-sectional view of an exemplary cross-point non-volatile semiconductor memory device. An upper Cu wire 338 (e.g., word line) and a lower Cu wire 318 (e.g., bit line) are arranged to cross each other at a right angle. A memory cell hole 326 is formed through a second interlayer insulating layer 319 at a cross-point of the upper Cu wire 338 and the lower Cu wire 318. A variable resistance element 333 (memory section) is formed inside the memory cell hole 326. The memory section 333 has a stacked-layer structure in which a precious metal electrode layer 330, a variable resistance layer 331, and an intermediate electrode 332 are stacked together inside the memory cell hole 326. A third interlayer insulating layer 337 is formed on the second interlayer insulating layer 319 including the intermediate electrode 332, by CVD (chemical vapor deposition) method, or the like. A wire trench 320 is formed in the third interlayer insulating layer 337. Inside the wire trench, a semiconductor layer 334 and an upper electrode 335 which become a part of a diode element 336, and the upper Cu wire 338, are formed.

Next, a description will be given of a manufacturing method of the cross-point variable resistance non-volatile semiconductor memory device of FIG. 13, with reference to FIGS. 14 to 17. FIGS. 14 to 17 are cross-sectional views showing the process steps in a time series manner.

Figure 14A:
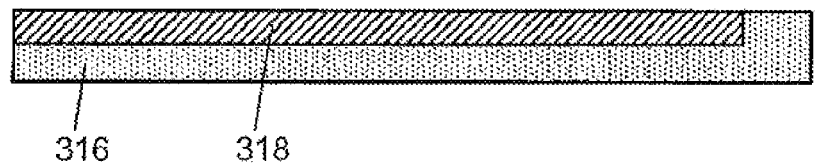
FIG. 14A is a cross-sectional view showing the step of forming lower Cu wires in a stripe shape, in the interlayer insulating layer, in a manufacturing method of the cross-point non-volatile semiconductor memory device.
Figure 14B:
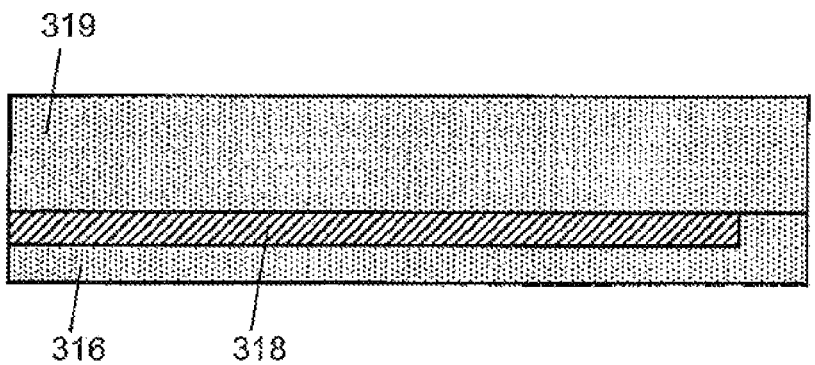
FIG. 14 B is a cross-sectional view showing the step of forming an interlayer insulating layer on the lower Cu wire, in the manufacturing method of the cross-point non-volatile semiconductor memory device.
FIG. 14C is a cross-sectional view showing the step of forming a memory cell hole in the interlayer insulating layer, in the manufacturing method of the cross-point non-volatile semiconductor memory device.
FIG. 14D is a cross-sectional view showing the step of forming a precious metal electrode layer (first electrode) in a bottom of the memory cell hole, in the manufacturing method of the cross-point non-volatile semiconductor memory device.

Initially, as shown in FIG. 14A, a plurality of lower Cu wires 318 are formed to make up a stripe shape on the first interlayer insulating layer 316 formed on, for example, a silicon substrate (not shown). Then, as shown in FIG. 14B, the second interlayer insulating layer 319 comprising TEOS-SiO, or the like is formed by CVD method or the like. In this case, to allow the memory cell hole 326 to be formed easily in the second interlayer insulating layer 319, the second interlayer insulating layer 319 may be configured to have a stacked-layer structure consisting of a plurality of layers to include SiN (silicon nitride layer), SiON (silicon oxynitride layer), SiCN (silicon carbon nitride layer), or the like, which serves as an etching stopper layer as a lower layer of the second interlayer insulating layer 319. In addition, a material such as SiON, having a higher resistance to CMP (chemical mechanical polishing) than TEOS-SiO may be formed as an upper layer of the second interlayer insulating layer 319. By forming SiON as the upper layer of the second interlayer insulating layer 319, CMP performed when the variable resistance layer 331 and the intermediate electrode 332 are filled into the memory cell hole 326 thereafter can be carried out easily and surely.

Figure 14C:
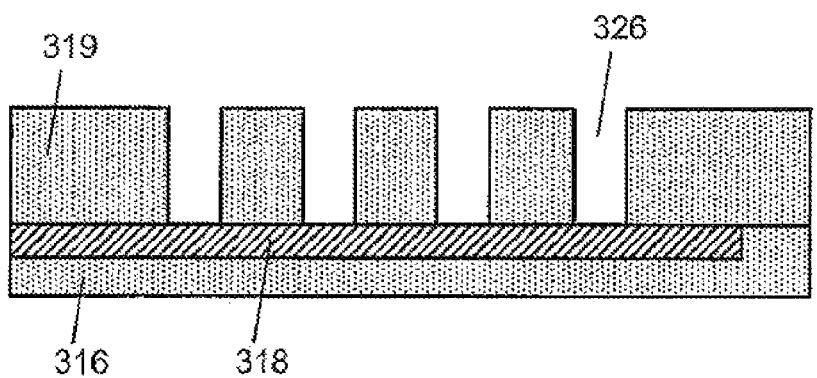

Then, as shown in FIG. 14C, the plurality of memory cell holes 326 are formed through the second interlayer insulating layer 319 at constant arrangement pitches such that the memory cell holes 326 are connected to the lower Cu wires 318, respectively. The memory cell hole 326 has a diameter smaller than a width of the lower Cu wire 318. The memory cell hole 326 is placed not to protrude outward from the corresponding lower Cu wire 318.

Figure 14D:
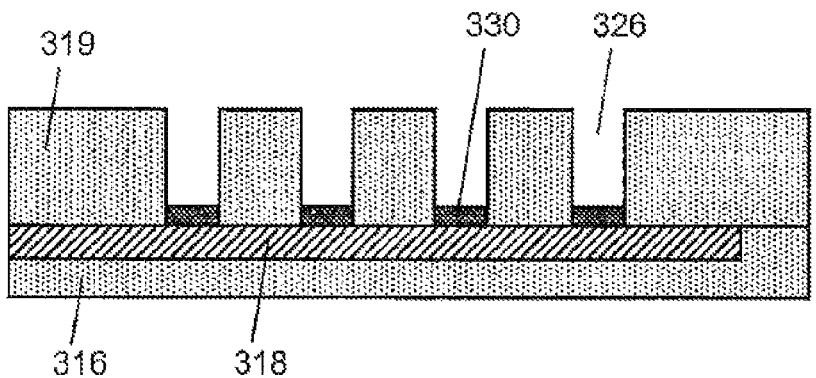

Then, as shown in FIG. 14D, by electroless selective growth plating, a precious metal electrode layer 330 comprising a material which is higher in standard electrode potential than metal constituting a variable resistance material is deposited on the lower Cu wire 318 exposed in the bottom of the memory cell hole 326. As the precious metal electrode, platinum (Pt), palladium (Pd), or the like is used. When Pt is used, hydrazine-ammonia Pt plating solution, Pt plating solution containing as a reducing agent boron compound or hypophosphorous acid, etc., may be used, as electroless Pt plating solution. The thickness of the Pt electrode layer may be set to not less than 5 nm and not more than 24 nm. By thinning the Pt electrode layer in this way, formation of hillocks of Pt due to thermal treatment can be suppressed and an interface between the Pt electrode layer and the variable resistance layer formed thereon can be planarized. By conducting the above electroless Pt plating after forming a seed layer containing one of nickel, nickel-phosphorus alloy, or nickel-boron alloy, on the lower Cu wire 318, Pt can be selectively grown on Cu more efficiently. The seed layer may have a stacked-layer structure of a combination of palladium and nickel, a combination of palladium and nickel-phosphorus alloy, or a combination of palladium and nickel-boron alloy. For example, the seed layer is formed in such a manner that catalyst metal (catalyst) which becomes a plating core is adsorbed onto Cu using Pd—Sn complex, tin salt is dissolved, and metal palladium is formed by redox reaction. Then, by electroless selective growth plating, a nickel seed layer is formed. Then, by electroless selective growth plating, a Pt layer is deposited on the nickel seed layer.

By using the electroless selective growth plating, precious metal is selectively deposited only on the lower Cu wire 318 which is an electric conductor, and the precious metal electrode is not deposited on the side wall of the memory cell hole 326 defined by the interlayer insulating layer. If the electrode material is deposited on the side wall of the memory cell hole 326, a current leak may possibly occur between an upper electrode and a lower electrode via the electrode material deposited on the side wall of the memory cell hole 326. However, by using the electroless selective growth plating, such a side wall current leak is prevented. In addition, the precious metal electrode layer 330 can be deposited only in the bottom portion of the memory cell hole 326 and is not deposited on the second interlayer insulating layer 319. Because of this, a step of removing a portion of the electrode material deposited on the second interlayer insulating layer 319 by CMP, etch-back process, or the like, is not necessary. In particular, it is difficult to remove the precious metal material by CMP because of its low reactivity. By using the electroless selective growth plating, the number of process steps can be reduced because of omission of the damascene process by CMP. In addition, the precious metal material can be deposited only in the bottom portion of the memory cell hole 326 and is not formed in regions on which the precious metal electrode should not be deposited. This results in a good cost performance.

Figure 15A:
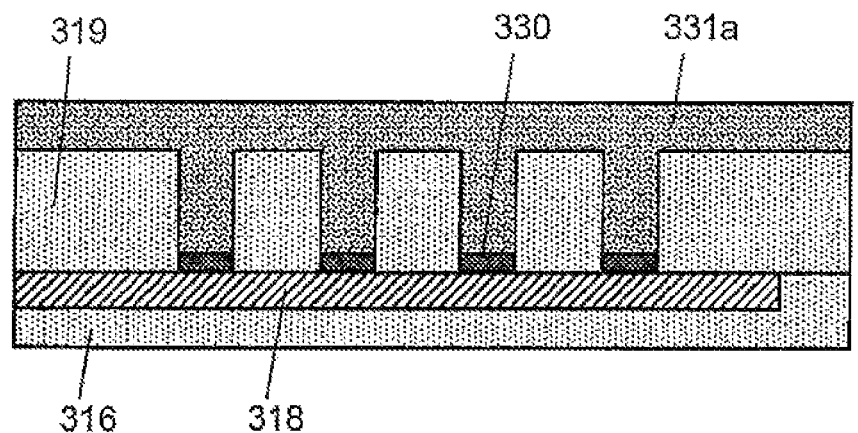
FIG. 15A is a cross-sectional view showing the step of forming a variable resistance material layer on the interlayer insulating layer and the precious metal electrode layer, in the manufacturing method of the cross-point non-volatile semiconductor memory device.

Then, as shown in FIG. 15A, a variable resistance material layer 331a which will become a variable resistance layer 331 is formed on the second interlayer insulating layer 319 including the memory cell hole 326. In the present embodiment, as the variable resistance material layer 331a, an oxygen-deficient tantalum oxide (when oxygen-deficient tantalum oxide is expressed as $TaO_x$, $0<x<2.5$) is used. As used herein, the oxygen-deficient tantalum oxide refers to an oxide which is less in oxygen content (atom ratio:ratio of oxygen atom number to a total atom number) than a tantalum oxide having a stoichiometric composition. Among tantalum oxides, $Ta_2O_5$ is stable in stoichiometric composition. Therefore, when the tantalum oxide is expressed as $TaO_x$, a tantalum oxide in which x is less than 2.5 is the oxygen-deficient tantalum oxide. The oxygen-deficient tantalum oxide has a semiconductive property.

Figure 15B:
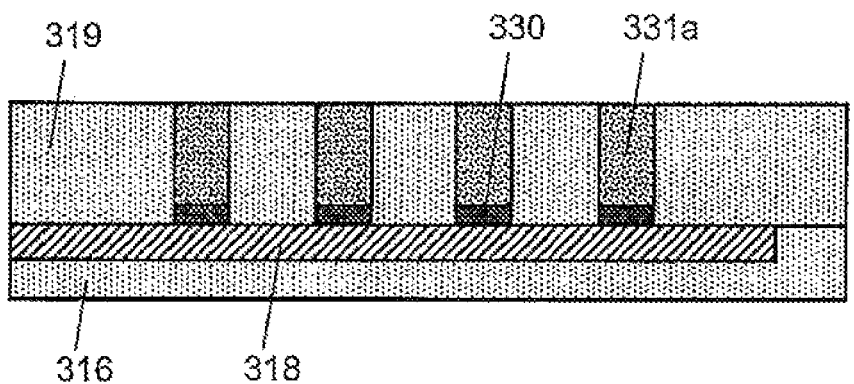
FIG. 15B is a cross-sectional view showing the step of removing a portion of the variable resistance material layer on the interlayer insulating layer, in the manufacturing method of the cross-point non-volatile semiconductor memory device.

Then, as shown in FIG. 15B, a portion of the variable resistance material layer 331a on the second interlayer insulating layer 319 is removed by CMP such that a variable resistance layer 331 is left and filled in the memory cell hole 326. Alternatively, the portion of the variable resistance material layer 331a on the second interlayer insulating layer 319 may be removed such that the variable resistance layer 331 is left and filled in the memory cell hole 326 by etch-back process, instead of CMP.

Figure 15C:
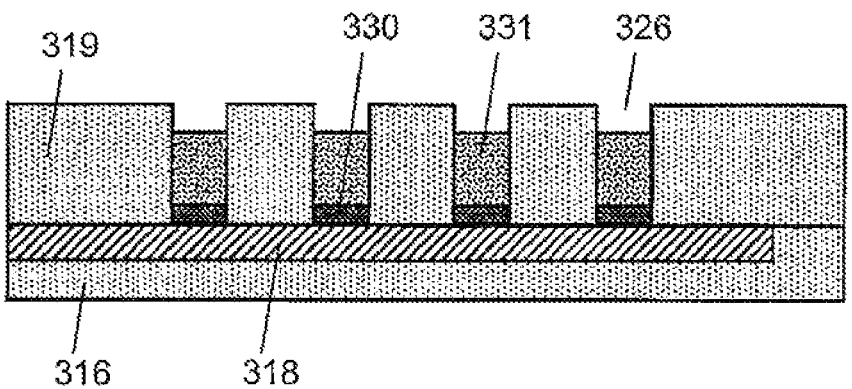
FIG. 15C is a cross-sectional view showing the step of removing an upper portion of the variable resistance material layer to form a variable resistance layer, in the manufacturing method of the cross-point non-volatile semiconductor memory device.

Then, as shown in FIG. 15C, by overpolishing, an upper portion of the variable resistance layer 331 inside the memory cell hole 326 is removed. The portion of the variable resistance layer 331 may be removed by etch-back process, instead of overpolishing.

Figure 16A:
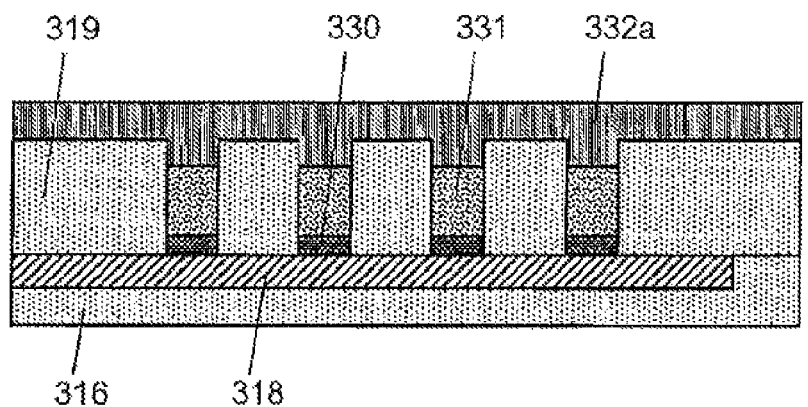
FIG. 16A is a cross-sectional view showing the step of forming an intermediate electrode material layer on the interlayer insulating layer and the variable resistance layer, in the manufacturing method of the cross-point non-volatile semiconductor memory device.

Then, as shown in FIG. 16A, an intermediate electrode material layer 332a which will become an upper electrode of the memory section 333 and a lower electrode of the diode element 336, is formed on the second interlayer insulating layer 319 including the memory cell hole 326. In the present embodiment, as the intermediate electrode material layer 332a, a material having a lower standard electrode potential than the precious metal electrode layer 330, for example, TaN, TiN, or W, is deposited by sputtering method.

By selecting the standard electrode potential of the material constituting the variable resistance element 333 as described above, a resistance changing phenomenon is allowed to take place selectively in a region of the variable resistance layer 331 in the vicinity of an interface between the precious metal electrode layer 330 and the variable resistance layer 331.

Figure 16B:
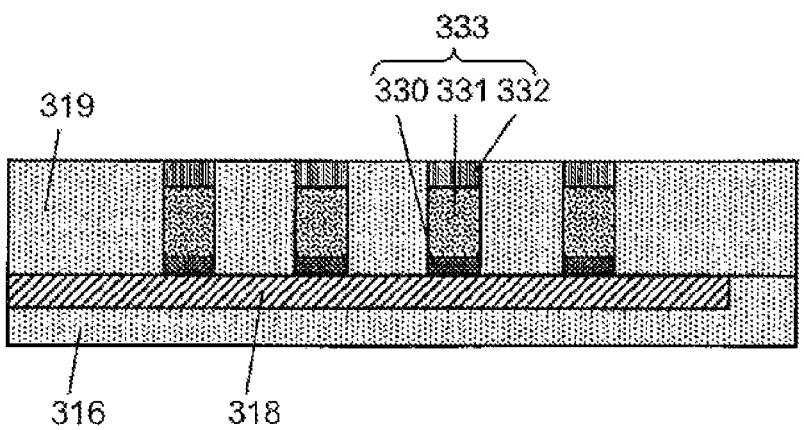
FIG. 16B is a cross-sectional view showing the step of removing a portion of the intermediate electrode material layer on the interlayer insulating layer to form an intermediate electrode, in the manufacturing method of the cross-point non-volatile semiconductor memory device.

Then, as shown in FIG. 16B, a portion of the intermediate electrode material layer 332a on the second interlayer insulating layer 319 is removed by CMP such that the intermediate electrode 332 is left and filled in the memory cell hole 326.

Figure 16C:
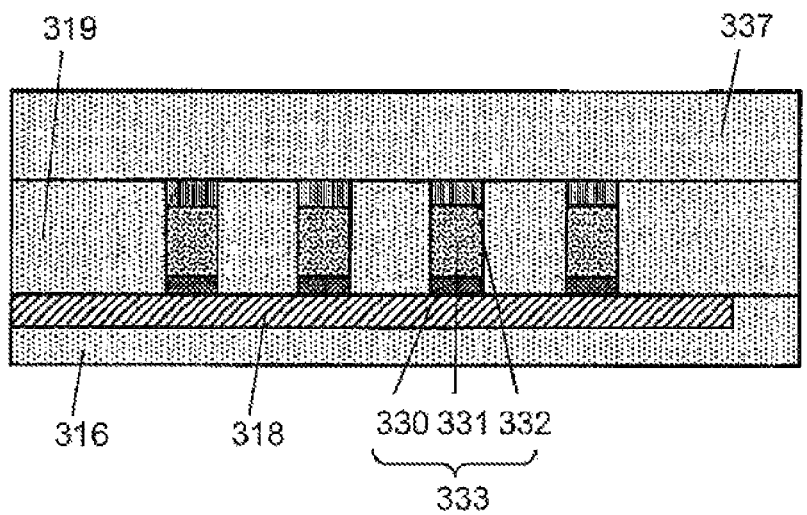
FIG. 16C is a cross-sectional view showing the step of forming an interlayer insulating layer on the interlayer insulating layer and on the intermediate electrode, in the manufacturing method of the cross-point non-volatile semiconductor memory device.

Then, as shown in FIG. 16C, a third interlayer insulating layer 337 is formed on the second interlayer insulating layer 319 including the intermediate electrode 332 by CVD method or the like.

Figure 17A:
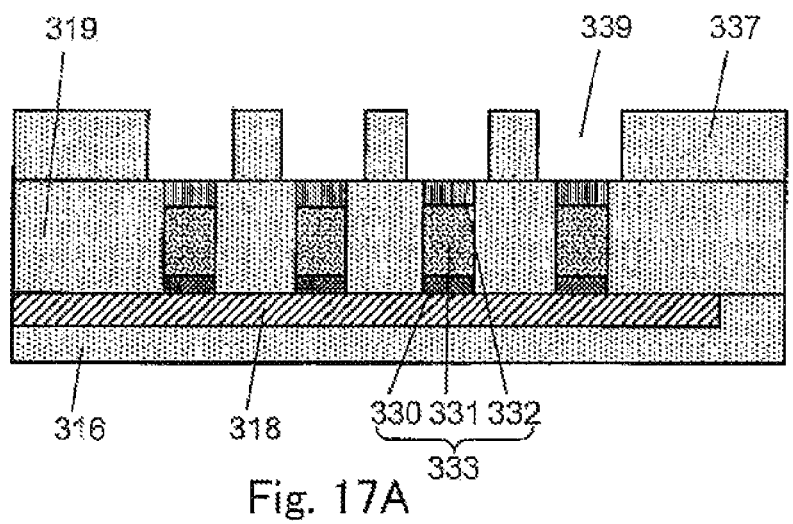
FIG. 17A is a cross-sectional view showing the step of forming a wire trench in the interlayer insulating layer, in the manufacturing method of the cross-point non-volatile semiconductor memory device.

Then, as shown in FIG. 17A, an upper Cu wire trench 339 into which a semiconductor layer 334 which will become a portion of the diode element 336, an upper electrode 335 which will become a portion of the diode element 336, and the upper Cu wire 338 are filled, is formed in the third interlayer insulating layer 337. In the present embodiment, the upper Cu wire trenches 339 are formed to make up a stripe shape to cross the lower Cu wires 318, respectively, thereby forming the semiconductor layers 334, the upper electrodes 335, and the upper Cu wires 338 in a stripe shape such that the semiconductor layers 334, the upper electrodes 335, and the upper Cu wires 338 cross the lower Cu wires 318, respectively.

Figure 17B:
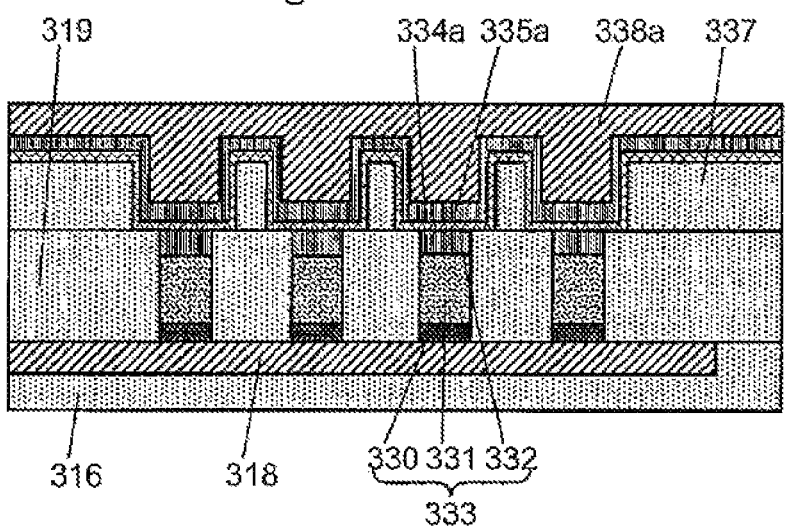
FIG. 17B is a cross-sectional view showing the step of depositing a semiconductor material layer, an upper electrode material layer, and an upper Cu wire material layer in this order, on the interlayer insulating layer and on the intermediate electrode, in the manufacturing method of the cross-point non-volatile semiconductor memory device.

Then, as shown in FIG. 17B, a semiconductor material layer 334a which will become the semiconductor layer 334 of the diode element 336, an upper electrode material layer 335a which will become the upper electrode 335 of the diode element 336, and an upper Cu wire material layer 338a which will become the upper Cu wire 338, are stacked on the third interlayer insulating layer 337 including the upper Cu wire trench 339.

In the present embodiment, an MSM diode is constituted by the semiconductor layer 334, the intermediate electrode 332 and the upper electrode 335, by using nitrogen-deficient silicon nitride ($SiN_z$, $0<z\leq0.85$) as the semiconductor layer 334, and for example, TaN, TiN, or α-W as the upper electrode 335. It is sufficient that the electrode material of the MSM diode is a material which forms a Schottky junction to the semiconductor layer 334. By appropriately selecting the electrode material, a voltage-current characteristic of the MSM diode is allowed to have a symmetric or non-symmetric characteristic between a positive voltage range and a negative voltage range. By using TaN, TiN or α-W as the electrode material as described above, it is possible to implement the MSM diode capable of flowing a current with a great magnitude of 10000 $A/cm^2$ or more. The $SiN_z$ layer having such a semiconductive property can be deposited by reactive sputtering in nitrogen gas atmosphere using, for example, an Si target. For example, the $SiN_z$ layer may be deposited under the conditions of, for example, a room temperature, a chamber pressure of 0.1 Pa~1 Pa, and an $Ar/N_2$ flow rate of 18 sccm/2 sccm.

When the $SiN_z$ having such a semiconductive property is formed such that Z is 0.3 and its thickness is 10 nm, a current density of $1\times10^4$ $A/cm^2$ is obtained by applying a voltage of 1.6 V, while a current density of $1\times10^3$ $A/cm^2$ is obtained by applying a voltage of 0.8 V. When these voltages are used as a reference, an ON/OFF ratio is 10. Thus, a diode element including such $SiN_z$ can be used satisfactorily as a diode element of a non-volatile semiconductor memory device.

The upper Cu wire 338 may be formed of the same material as that of the lower Cu wire 318.

Figure 17C:
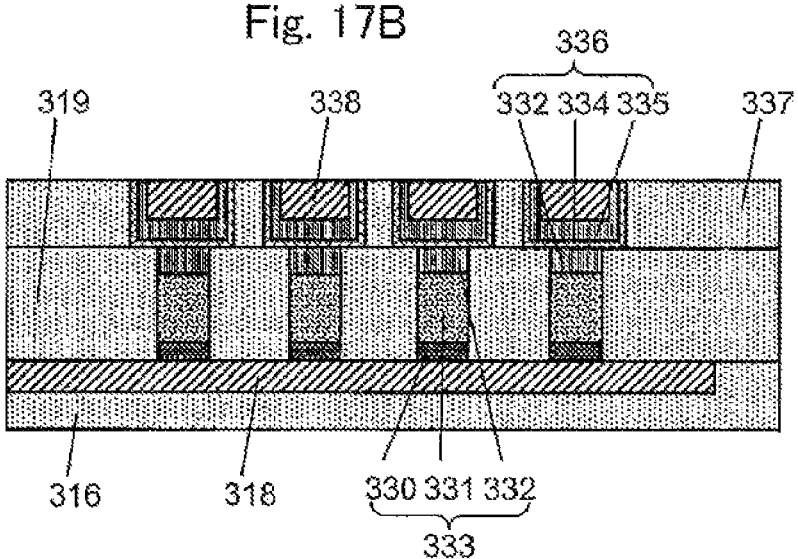
FIG. 17C is a cross-sectional view showing the step of removing a portion of the semiconductor material layer, a portion of the upper electrode material layer, and a portion of the upper Cu wire material layer which are on the interlayer insulating layer, to form a semiconductor layer, an upper electrode, and an upper Cu wire, in the manufacturing method of the cross-point non-volatile semiconductor memory device.

Then, as shown in FIG. 17C, a portion of the semiconductor material layer 334a, a portion of the upper electrode material layer 335a, and a portion of the upper Cu wire material layer 338a, which are on the third interlayer insulating layer 337, are removed by CMP, thereby leaving the semiconductor layer 334 of the diode element 336, the upper electrode 335 of the diode element 336, and the upper Cu wire layer 338 in the upper Cu wire trench 339 such that they are filled in the upper Cu wire trench 339.

Through the above steps, the memory section 333 is formed by the precious metal electrode layer 330, the variable resistance layer 331 and the intermediate electrode 332, while the diode element 336 is formed by the intermediate electrode 332, the semiconductor layer 334 and the upper electrode 335. Thus, the cross-point non-volatile semiconductor memory device can be manufactured.

As described above, in the above described non-volatile semiconductor memory device, a miniaturized structure is implemented by forming the variable resistance elements 333 inside the memory cell holes 326 formed on the lower Cu wires 318 of a stripe shape, respectively, and the precious metal electrode layers 330 used as the lower electrodes of the variable resistance element 333 are formed only in the bottoms of the memory cell holes, respectively, by electroless selective growth plating.

Typically, unlike electroplating, in the electroless plating, no electric field is applied to a target on which a plated layer is to be deposited, but a plated material dissolved in a plating solution is precipitated through a chemical reduction reaction to form the layer on the target.

However, in a case where the above stated targets (locations) to be plated are, for example, the bottoms of miniaturized memory cell holes, which have small area and have a high aspect ratio (height of the memory cell hole/maximum dimension in the bottom of the memory cell hole), a difference occurs in time periods from when the targets are immersed in the plating solution until deposition of the plated material in the bottoms of the memory cell holes is initiated. In the electroless plating, once deposition of the plated layer is initiated, the layer is grown substantially in proportion to time. The difference in the times at which the deposition is initiated tends to be greater when the targets have a smaller area and a higher aspect ratio. Because of this, non-uniformity in thicknesses of the plated layers occurs among the memory cell holes, even though the targets are plated in a plating solution for an equal time period. However, in a case where the targets (locations) to be plated have small areas but are electrically connected to each other (e.g., the targets to be plated are the bottoms of the memory cell holes on the same wire), once deposition of the plated material in one location is initiated, its electric potential change propagates to another locations, where deposition of the plated material is initiated at the same time. Because of this, in the case of the above described configuration, the plated layers in the bottoms of the memory cell holes on the same wire are free from non-uniformity in thicknesses. However, it is more likely that the plated layers in the bottoms of the memory cell holes formed on different wires are non-uniform in thickness. This will cause a bit failure. The bit failure attributed to the non-uniformity in thicknesses of the plated layers is severer as the degree to which the memory cell holes are miniaturized increases.

The present invention is directed to solving the bit failure associated with the non-uniformity in thicknesses of the plated layers, to providing a structure which can lessen non-uniformity in thicknesses of the plated layers formed in bottom portions of memory cell holes, in a cross-point memory array, and to suppressing an increase in the non-uniformity even in miniaturized memory cell holes. Now, specific examples will be described.

(Embodiment 1)

A non-volatile semiconductor memory device according to Embodiment 1 comprises a substrate; a plurality of first wires of a stripe shape which are formed on the substrate; an interlayer insulating layer formed to cover the plurality of first wires; a plurality of second wires of a stripe shape which are formed on the interlayer insulating layer such that the plurality of second wires are located above the plurality of first wires and cross the plurality of first wires, respectively; a plurality of memory cell holes formed at cross-points of the plurality of first wires and the plurality of second wires, respectively, when viewed from above, the plurality of memory cell holes being formed through the interlayer insulating layer between the plurality of first wires and the plurality of second wires such that the memory cell holes expose upper surfaces of the plurality of first wires, respectively; a plurality of dummy holes formed on the plurality of first wires, respectively, in the interlayer insulating layer such that the plurality of dummy holes reach the upper surfaces of the plurality of first wires, respectively; and stacked-layer structures formed inside the memory cell holes and inside the dummy holes, respectively, each of the stacked-layer structures including a first electrode and a variable resistance layer formed on the first electrode; an area of a portion of the first wire which is exposed in a lower opening of one of the dummy holes being greater than an area of a portion of the first wire which is exposed in a lower opening of one of the memory cell holes; and one or more of the dummy holes being formed in each of the first wires.

The stripe shape refers to a shape in which a plurality of wires extend in a particular direction and in parallel with each other, in a certain plane.

The wordings "expose upper surfaces of first wires" mean a state where the memory cell holes reach the upper surfaces of the first wires and the first wires are exposed in lower openings of the memory cell holes, respectively. The wording "expose" means that the memory cell hole may be filled with a material, rather than a configuration in which the interior of the memory cell hole is vacant. In other words, the first wire may contact any material other than the interlayer insulating layer inside the memory cell hole.

Regarding "first electrodes formed inside the dummy holes," the first electrode inside the dummy hole need not function as the electrode of the variable resistance element.

In the non-volatile semiconductor memory device, the second wires may not be formed above the dummy holes.

In the non-volatile semiconductor memory device, the dummy holes may have a rectangular shape when viewed from above, the memory cell holes may have a circular shape when viewed from above, a short-side length of the rectangular shape may be equal to or greater than a diameter of the circular shape, and a long-side length of the rectangular shape may be greater than the diameter of the circular shape.

In the non-volatile semiconductor memory device, a side surface of each of the first wires may be exposed in a lower opening of a corresponding one of the dummy holes.

In the non-volatile semiconductor memory device, the first electrode may comprise at least one of platinum, palladium, and a mixture containing at least one of platinum and palladium.

The non-volatile semiconductor memory device may comprise seed layers placed between the first wires and the first electrodes, respectively; and each of the seed layers may comprise at least one of nickel, nickel-phosphorus alloy, and nickel-boron alloy, and the first electrode comprises at least one of platinum and palladium.

In the non-volatile semiconductor memory device, each of the seed layers may comprise at least one of a stacked-layer structure of palladium and nickel, a stacked-layer structure of the palladium and nickel-phosphorus alloy, and a stacked-layer structure of the palladium and nickel-boron alloy, and the first electrode may comprise at least one of platinum and palladium.

In the non-volatile semiconductor memory device, the variable resistance layer may comprise an oxygen-deficient transition metal oxide which is less in oxygen content than an oxide having a stoichiometric composition.

A method of manufacturing a non-volatile semiconductor memory device of Embodiment 1, comprises a step (A) of forming a plurality of first wires of a stripe shape on a substrate; a step (B) of forming an interlayer insulating layer on the substrate including the plurality of first wires; a step (C) of forming, in the interlayer insulating layer, a plurality of memory cell holes and at least one dummy hole such that the memory cell holes and the dummy hole reach upper surfaces of the plurality of first wires, the dummy hole having a greater lower opening area than the memory cell holes; a step (D) of depositing a first electrode material on the plurality of first wires exposed in lower openings of the memory cell holes and a lower opening of the dummy hole, by electroless selective growth plating, to form first electrodes inside the memory holes, respectively; a step (E) of filling variable resistance layers inside the plurality of memory cell holes, respectively such that the variable resistance layers are located on the first electrodes, respectively; and a step (F) of forming a plurality of second wires of a stripe shape on the interlayer insulating layer and on the variable resistance layers filled inside the memory cell holes such that the second wires cross the plurality of first wires, respectively.

In the method of manufacturing the non-volatile semiconductor memory device, in the step (C), the dummy holes may have a rectangular shape when viewed from above, the memory cell holes may have a circular shape when viewed from above, a short-side length of the rectangular shape may be equal to or greater than a diameter of the circular shape, and a long-side length of the rectangular shape may be greater than the diameter of the circular shape.

The method of manufacturing the non-volatile semiconductor memory device may comprise, after the step (C) and before the step (D), a step (G) of depositing seed layers on the first wires, respectively, by electroless selective growth plating; and in the step (D), the first electrode material may be deposited on the seed layers.

The method of manufacturing the non-volatile semiconductor memory device may comprise: after the step (E) and before the step (F), a step (H) of forming diode elements on the variable resistance layers, respectively; and in the step (F), the plurality of second wires may be formed on the diode elements, respectively.

[Configuration of Device]

Figure 1:
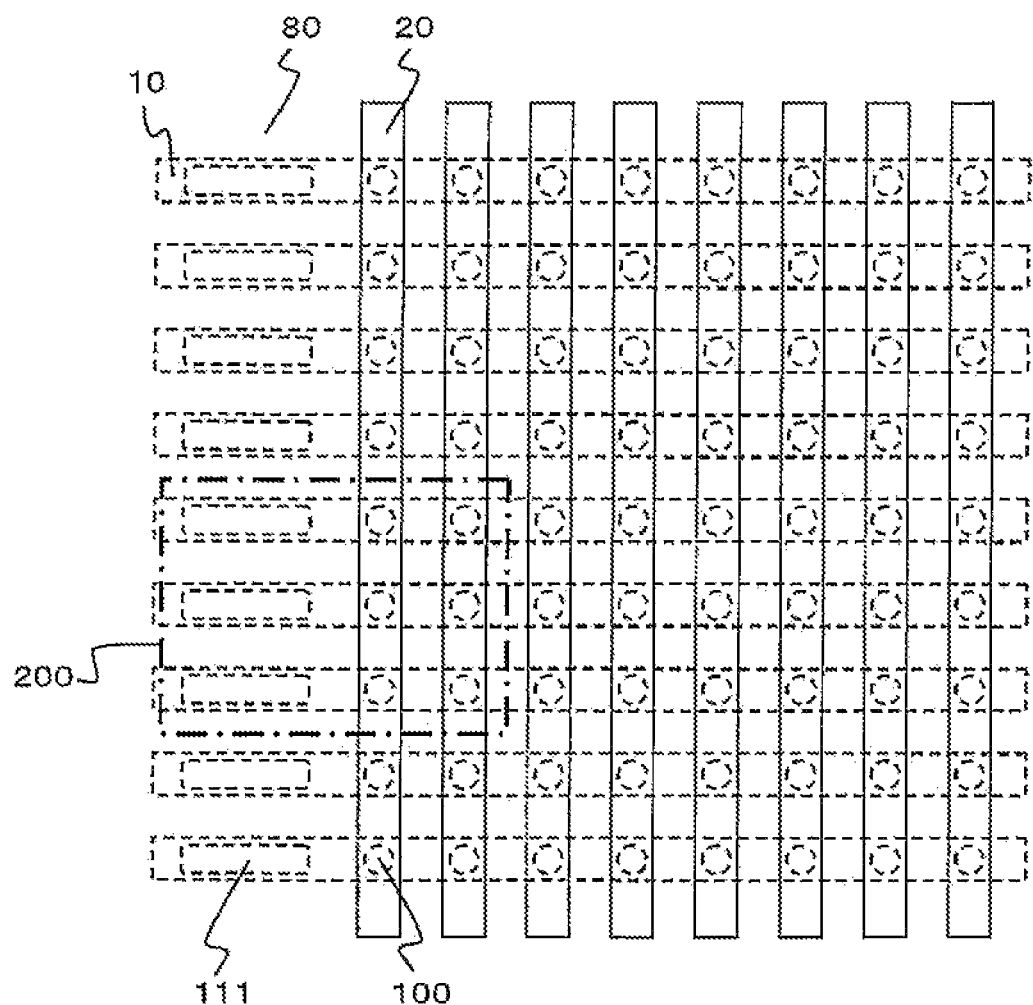
FIG. 1 is a schematic view showing an exemplary configuration of a non-volatile semiconductor memory device according to Embodiment 1.

FIG. 1 is a plan view showing an exemplary configuration of a non-volatile semiconductor memory device according to Embodiment 1 of the present invention.

As shown in FIG. 1, the non-volatile semiconductor memory device of the present invention includes a plurality of first wires 10 of a stripe shape which are formed on a substrate (not shown), an interlayer insulating layer 80 formed to cover the first wires, and a plurality of second wires 20 of a stripe shape which are formed in the interlayer insulating layer 80 such that the second wires 20 cross the first wires 10, respectively. Memory cell holes are formed through the interlayer insulating layer 80 between the first wires 10 and the second wires 20, in cross-points of the first wires 10 and the second wires 20, when viewed from above. A plurality of variable resistance elements 100 are formed inside the memory cell holes, respectively such that each variable resistance element 100 has a stacked-layer structure of the first electrode and a resistance variable later stacked thereon, and a lower surface of the first electrode is connected to an upper surface of the first wire. A plurality of dummy holes 111 are formed through the interlayer insulating layer 80 on the first wires 10, respectively such that each dummy hole 111 reaches the upper surface of the corresponding first wire 10. On each of the first wires 10, one or more variable resistance elements 100 and one or more dummy holes 111 are formed.

Although each of the first wires 10 is depicted as a single straight wire in FIG. 1, beneficial effects of the present invention can be achieved without forming a wire in a straight-line shape. In addition, a plurality of wires arranged spatially apart from each other may be collectively assumed as a single wire so long as at least one memory cell hole or at least one dummy hole is formed on each of the wires, an electrode is deposited in a bottom of the memory cell hole or in a bottom of the dummy hole by the same electroless selective growth plating step, and the wires are electrically connected to each other to be at equipotential at the time point when the step of that electroless selective growth plating step is performed. For example, in the present invention, in a case where a wire on which the dummy hole is formed is separated from a wire on which the variable resistance element is formed when viewed from above, but these wires are electrically connected to each other by way of metal via elements connected to lower surfaces of these wires and wires formed under the metal via elements, the wire on which the dummy hole is formed and the wire on which the variable resistance element is formed may be assumed as a single first wire.

Figure 18:
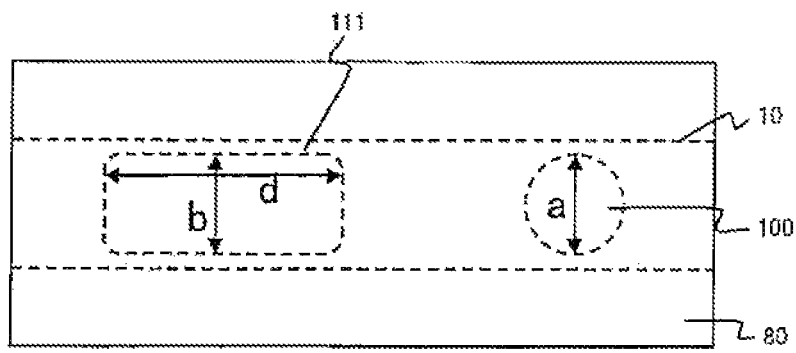
FIG. 18 is a view showing a desirable shape of a dummy hole of the present invention.
Figure 19:
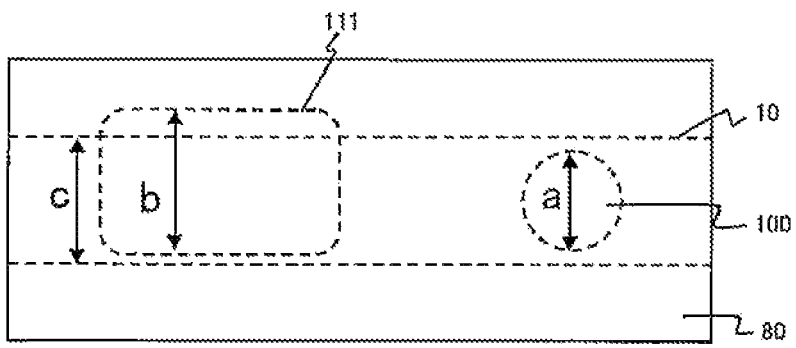
FIG. 19 is a view showing a desired layout of the dummy hole of the present invention.
Figure 20:
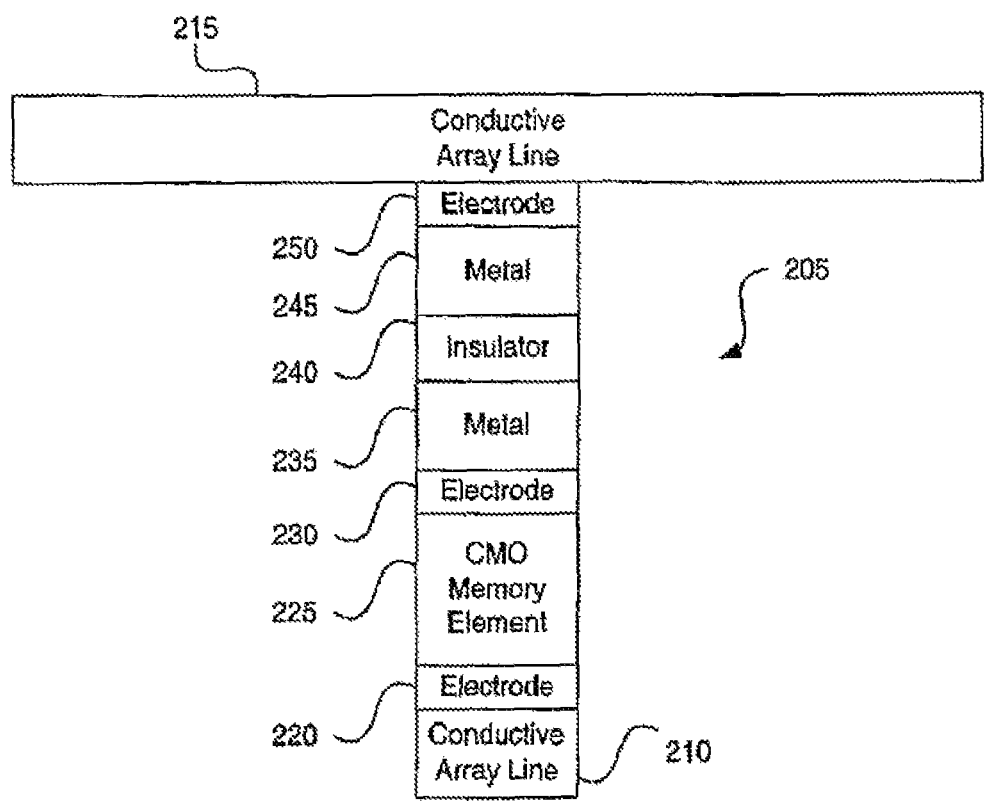
FIG. 20 is a cross-sectional view showing a configuration of a conventional non-volatile semiconductor memory device.

By setting an area of the dummy hole 111 which overlaps with a portion of the first wire 10 greater than an area of the variable resistance element 100 which overlaps with a portion of the first wire 10 when viewed from above, plating in a bottom of the dummy hole 111 is firstly initiated in an electroless selective growth plating step of the electrode. Subsequently, plating is initiated substantially at the same time in bottoms of the plurality of memory cell holes electrically connected to the dummy hole. Thus, the beneficial effects of the present invention are achieved. It is desired that an area of the bottom of the dummy hole 111 allow plating to be initiated at the same time in bottoms of all of the dummy holes 111. The shape of the dummy hole 111 when viewed from above may be an oval, a rectangle, or a polygon, instead of a circle. To prevent an increase in a layout area of the dummy hole 111 in a planar layout, as shown in FIG. 18, the dummy hole 111 desirably has a shape when viewed from above such that a short-side dimension b is equal to or greater than a diameter a of the variable resistance element 100 when viewed from above, and is equal to or smaller than a width c of the first wire 10 under the dummy hole (c≥b≥a) and is smaller than a long-side dimension d (d>b). As shown in FIG. 19, the dummy hole 111 may be laid out such that a portion of the dummy hole 111 protrudes outward from the first wire 10 located under the dummy hole 111 when viewed from above (b>c>a). In this case, by performing overetching in the step of forming the dummy hole by etching, to expose a side surface of the first wire 10 in a portion of the dummy hole 111 protruding outward from the periphery of the first wire 10. This makes it possible to increase a surface area of the first wire 10 in the bottom of the dummy hole. In this way, by using the dummy holes, uniformity in thicknesses of the plated layers can be attained more effectively. The shapes and the layout are the same in Embodiment 2 as described later.

In the case of d>b and b≥a, d≥a is satisfied. That is, the long-side dimension d of the dummy hole 111 is desirably greater than the diameter a (=diameter of the memory cell hole) of the shape of the variable resistance element 100 when viewed from above.

An area of the first wire 10 exposed in a lower opening of the dummy hole 111 is greater than an area of the first wire 10 exposed in a lower opening of the memory cell hole 101. Preferably, the area of the first wire 10 exposed in the lower opening of the dummy hole 111 is equal to or greater than twice as great as the area of the first wire 10 exposed in the lower opening of the memory cell hole 101. More preferably, the area of the first wire 10 exposed in the lower opening of the dummy hole 111 is equal to or greater than five times as great as the area of the first wire 10 exposed in the lower opening of the memory cell hole 101. Most preferably, the area of the first wire 10 exposed in the lower opening of the dummy hole 111 is equal to or greater than ten times as great as the area of the first wire 10 exposed in the lower opening of the memory cell hole 101.

A bottom surface of the variable resistance element 100 is connected to an upper surface of the first wire 10. A bottom of the dummy hole 111 reaches the upper surface of the first wire 10. A plurality of variable resistance elements 100 are formed at cross-points of the first wires 10 and the second wires 20, thereby constituting a cross-point non-volatile semiconductor memory device.

Although not shown, a transistor circuit and the like are formed preliminarily on the substrate of the non-volatile semiconductor memory device of the present embodiment. The transistor circuit is electrically connected to the first wire 10 and to the second wire 20. The same applies to Embodiment 2 described later.

Figure 2A:
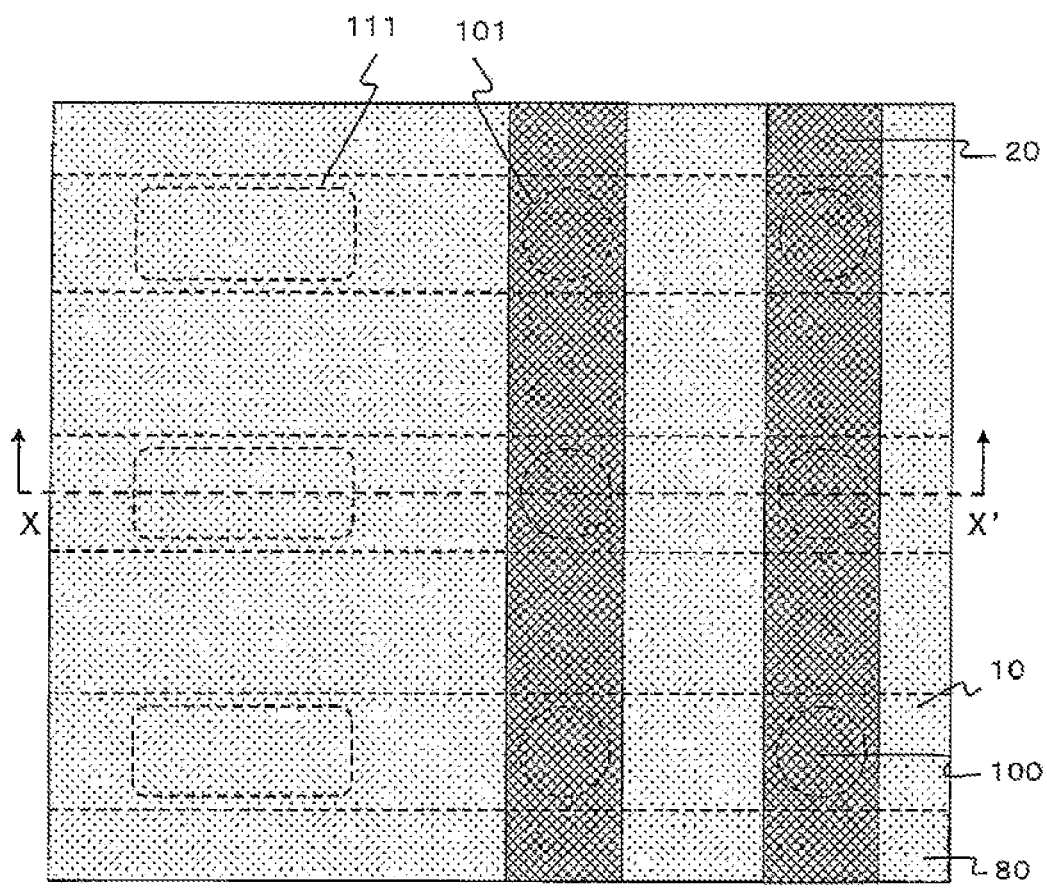
FIG. 2A is a plan view showing a detailed configuration of the non-volatile semiconductor memory device according to Embodiment 1 of the present invention.
Figure 2B:
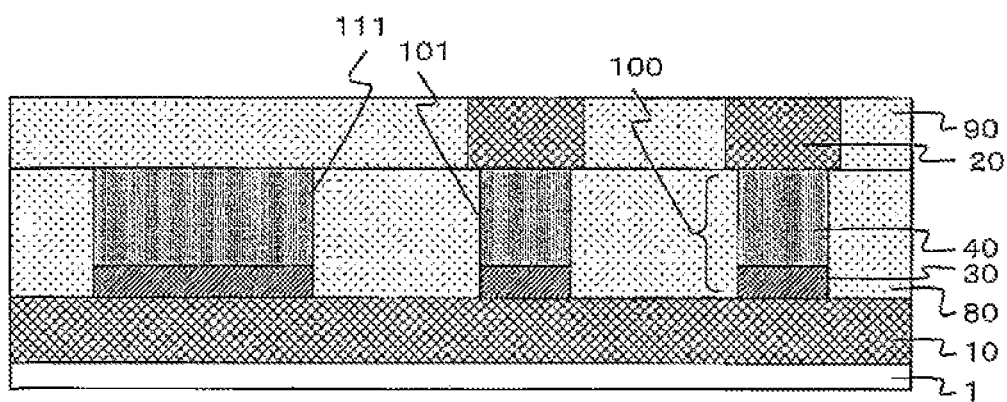
FIG. 2B is a cross-sectional view taken in the direction of arrows along X-X' in FIG. 2A.

FIG. 2A is an enlarged view showing a detailed configuration of a first region 200 of FIG. 1. FIG. 2B is a cross-sectional view taken in the direction of arrows along X-X' in FIG. 2A.

As shown in FIGS. 2A and 2B, the variable resistance element 100 of the present embodiment includes a first electrode 30 and a variable resistance layer 40 which are formed sequentially on the upper surface of the first wire 10 of the substrate 1 in an upward direction perpendicular to the substrate. In the present embodiment, the second wires 20 are formed within an interlayer insulating layer 90 to make up a stripe shape and cross the first wires 10, respectively. The variable resistance element 100 has a stacked-layer structure of the first electrode 30 and the variable resistance layer 40 formed on the first electrode 30. As the variable resistance layer 40, an oxygen-deficient transition metal oxide such as oxygen-deficient tantalum oxide (TaOx) is preferable to achieve stability of a resistance changing characteristic of the variable resistance layer 40, good repeatability of production of the variable resistance layer 40, etc. The variable resistance element may be formed using another variable resistance material provided that at least one of the electrodes comprises precious metal such as platinum or palladium. As shown in FIG. 1, the second wires 20 are extended to outside a region where the variable resistance elements 100 are laid out in matrix.

An area of a portion of the first wire 10 which is exposed by the dummy hole 111 is greater than an area of a bottom surface of the variable resistance element 100 which contacts an upper surface of a portion of the first wire 10.

As described above, in accordance with the configuration of the present embodiment, when the first electrodes 30 are deposited by electroless selective growth plating, deposition of the electrode material in a particular dummy hole 111 is initiated preferentially, and thereafter, deposition of the electrode material in all of the dummy holes 111 is initiated almost at the same time. Therefore, deposition of the first electrodes 30 in the variable resistance elements 100 is initiated almost at the same time. Because of this, non-uniformity in the thicknesses of the plated layers of the first electrodes 30 can be suppressed.

[Manufacturing Method]

Next, a description will be given of a manufacturing method of the non-volatile semiconductor memory device of Embodiment 1, with reference to FIGS. 3A~3C and FIGS. 4A~4C. FIGS. 3A~3C and FIGS. 4A~4C are cross-sectional views showing the process steps performed to form the constituents of FIG. 2B.

Figure 3A:
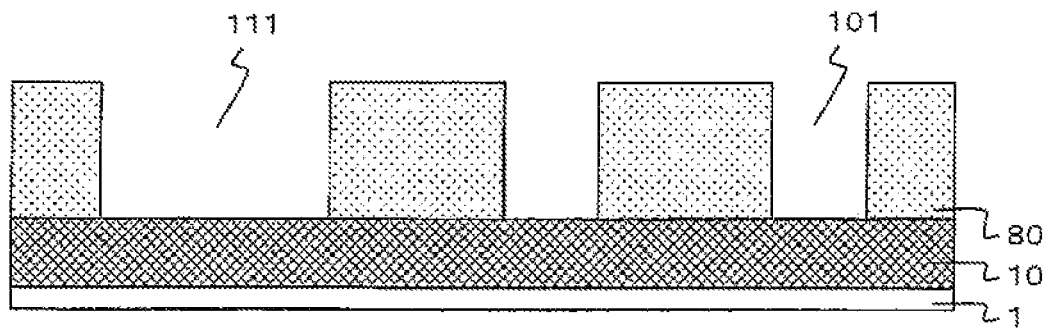
FIG. 3A is a cross-sectional view showing the step of forming on a substrate a first wire and an interlayer insulating layer provided with a hole reaching the first wire, in a manufacturing method of the non-volatile semiconductor memory device according to Embodiment 1.

As shown in FIG. 3A, initially, the first wire 10 is formed on the substrate 1. Although in the present embodiment, a copper (Cu) wire formed by a damascene process is used as the first wire 10, an aluminum (Al) wire formed by a general process may be used. For example, a width of the first wire may be set to 250 nm, and an interval between the first wires may be set to 250 nm.

Then, the interlayer insulating layer 80 comprising TEOS-SiO and being 200 nm-thick is deposited by, for example, CVD method. As the interlayer insulating layer 80, a silicon oxide ($SiO_2$) deposited by the CVD method, a TEOS-$SiO_2$ layer deposited using ozone ($O_3$) and tetraethoxysilane (TEOS) by CVD method, a silicon oxycarbite (SiOC) layer which is a low dielectric constant material, a fluorinated silicon oxide (SiOF) layer which is a low dielectric constant material, etc. may be used.

To easily form the hole in the interlayer insulating layer 80, the interlayer insulating layer 80 may be formed to include a plurality of interlayer insulating layers in such a manner that a lower layer of the interlayer insulating layer 80 is formed using a material having etching resistance to dry etching using fluorinated etching gas, to be specific, a silicon nitride (SiN) layer deposited by CVD, a silicon oxynitride (SiON) layer deposited by CVD, a silicon carbon nitride (SiCN) layer deposited by CVD, etc., and an upper layer of the interlayer insulating layer 80 is formed using an insulative oxide material other than the above SiN and SiON.

Then, the memory cell hole 101 and the dummy hole 111 are formed through the interlayer insulating layer 80 such that they reach the upper surface of the first wire 10. A diameter of the memory cell hole 101 may be set to 200 nm. A surface area of a portion of the first wire 10 which is exposed in a bottom of the dummy hole 111 is greater than a surface area of a portion of the first wire 10 which is exposed in a bottom of the memory cell hole 101. In the present embodiment, the dummy hole 111 may have, for example, a rectangle-like shape having rounded corners with a short-side length of 200 nm, and a long-side length of 400 nm, when viewed from above. A long-side direction of the dummy hole 111 suitably conforms to a long-side direction of the first wire 10.

Figure 3B:
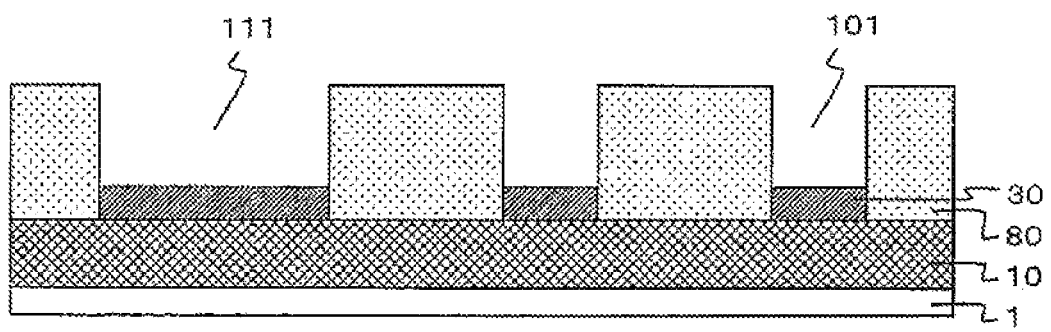
FIG. 3B is a cross-sectional view showing the step of forming a first electrode in a bottom of the hole, in the manufacturing method of the non-volatile semiconductor memory device according to Embodiment 1.

Then, as shown in FIG. 3B, the first electrode 30 is deposited by plating for selectively growing the electrode material only in the bottom of the memory cell hole 101 and in the bottom of the dummy hole 111. In the present embodiment, the first electrode 30 is deposited by using electroless selective growth plating of platinum (Pt) which is an electrode material which allows $TaO_x$ to exhibit a good resistance changing characteristic. As electroless Pt plating solution, hydrazine-ammonia Pt plating solution, Pt plating solution comprising as a reducing agent boron compound or hypophosphorous acid, etc., may be used. Although the thickness of the Pt electrode layer is 5 nm, it may be set to not less than 5 nm and not more than 24 nm. By thinning the Pt electrode layer in this way, formation of hillocks of Pt due to thermal treatment can be suppressed and an interface between the Pt electrode layer and the variable resistance layer can be planarized. By conducting the above electroless Pt plating after forming a seed layer containing one of nickel, nickel-phosphorus alloy, or nickel-boron alloy, on the lower Cu wire exposed in the bottom of the memory cell hole 101 and in the bottom of the dummy hole 111, Pt can be selectively grown on Cu more efficiently. Alternatively, the seed layer may have a stacked-layer structure of a combination of palladium and nickel, a combination of palladium and nickel-phosphorus alloy, or a combination of palladium and nickel-boron alloy.

Figure 3C:
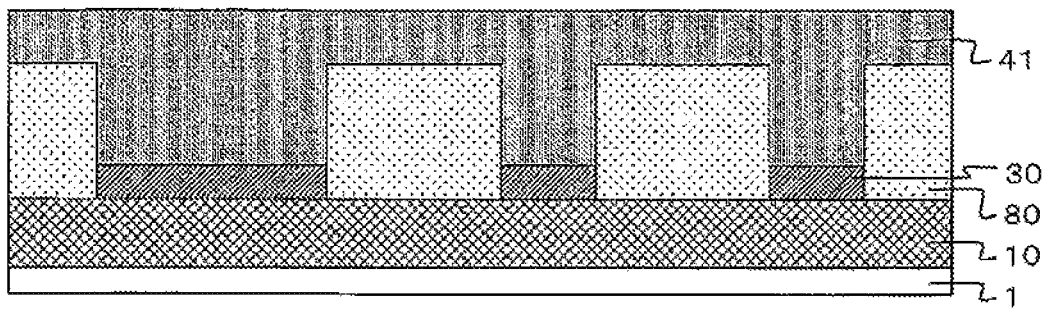
FIG. 3C is a cross-sectional view showing the step of forming a variable resistance material layer on the interlayer insulating layer and the first electrode, in the manufacturing method of the non-volatile semiconductor memory device according to Embodiment 1.

Then, as shown in FIG. 3C, a variable resistance material layer 41 which will become the variable resistance layer 40 is formed on the interlayer insulating layer 80 including the memory cell hole 101 and the dummy hole 111. In the present embodiment, as the variable resistance material layer 41, for example, an oxygen-deficient tantalum oxide ($TaO_x$) which is less in oxygen content as an atom ratio than an oxide having a stoichiometric composition, may be deposited by sputtering. A suitable range of $TaO_x$ is preferably $0.8 \le x \le 1.9$. Instead of the tantalum oxide, a hafnium oxide or a zirconium oxide may be used. When the hafnium oxide is expressed as $HfO_x$, $0.9 \le x \le 1.6$ is preferable. When the zirconium oxide is expressed as $ZrO_x$, $0.9 \le x \le 1.4$ is preferable. By adjusting a ratio of an oxygen gas flow rate with respect to an argon gas flow rate during sputtering, the value of x in chemical formulas of $TaO_x$, $HfO_x$, and $ZrO_x$ can be adjusted.

A description will be given of a specific process step of sputtering in a case where the oxygen-deficient tantalum oxide is used as the variable resistance layer. Firstly, the substrate is installed within a sputtering apparatus. The interior of the sputtering apparatus is evacuated to about $7 \times 10^{-4}$ Pa. Then, using tantalum as a target, sputtering is performed under conditions in which a power is 250 W, a total gas pressure of argon gas and oxygen gas is 3.3 Pa, and a substrate temperature is set to 30 degrees C. When an oxygen partial pressure ratio is changed from 1% to 7%, an oxygen content in the tantalum oxide layer changes from about 40% ($TaO_{0.66}$) to about 70% ($TaO_{2.3}$). The composition of the tantalum oxide layer can be measured by Rutherford back-scattering method. As used herein, the wordings "oxide having a stoichiometric composition" refer to $Ta_2O_5$ as an insulator in the case of the tantalum oxide. When the tantalum oxide is oxygen-deficient tantalum oxide, this metal oxide is allowed to have electric conductivity. As a deposition method, CVD, ALD, or the like may be used instead of the sputtering method. Alternatively, after a metal Ta layer is deposited, the Ta layer may be oxidized to form $TaO_x$. A thickness of the variable resistance material layer 41 which allows the memory cell hole 101 to be embedded therein is sufficient, and may be for example, 400 nm in the present embodiment so that the step of removing an upper portion of the variable resistance material layer 41 is performed easily later. As the variable resistance material layer 41, an oxygen-deficient iron oxide, an oxygen-deficient titanium oxide, an oxygen-deficient vanadium oxide, an oxygen-deficient cobalt oxide, an oxygen-deficient nickel oxide, an oxygen-deficient zinc oxide, an oxygen-deficient niobium oxide, an oxygen-deficient zirconium oxide, or an oxygen-deficient hafnium oxide may be used, as well as the oxygen-deficient tantalum oxide.

Figure 4A:
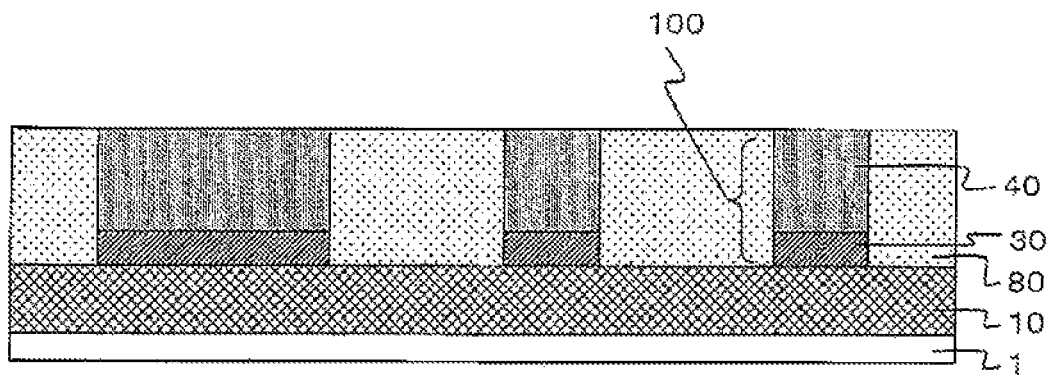
FIG. 4A is a cross-sectional view showing the step of removing a portion of the variable resistance material layer on the interlayer insulating layer to form a variable resistance layer, in the manufacturing method of the non-volatile semiconductor memory device according to Embodiment 1.

Then, as shown in FIG. 4A, a portion of the variable resistance material layer 41 on the interlayer insulating layer 80 is removed by CMP, thereby leaving the variable resistance layer 40 in the memory cell hole 101 and in the dummy hole 111 such that the memory cell hole 101 and the dummy hole 111 are filled with the variable resistance layer 40. The portion of the variable resistance material layer 41 on the interlayer insulating layer 80 may be removed by etch-back process instead of CMP.

Figure 4B:
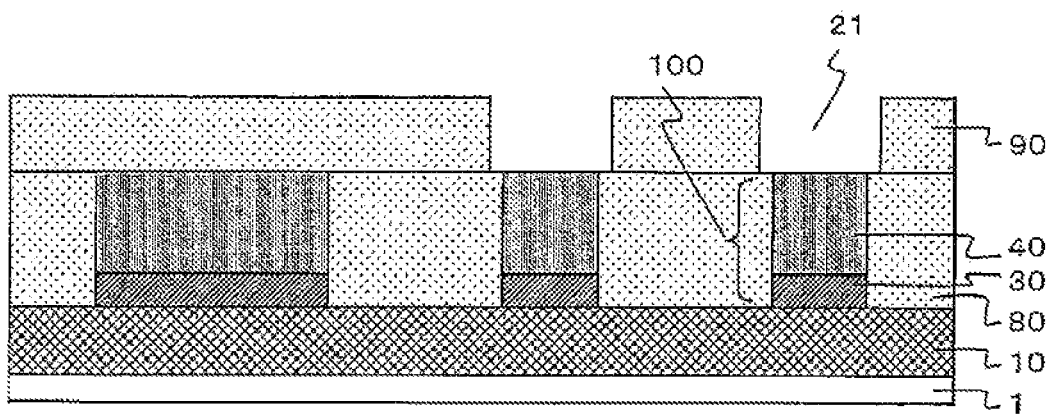
FIG. 4B is a cross-sectional view showing the step of forming an interlayer insulating layer provided with a second wire trench, over the interlayer insulating layer and the variable resistance layer.

Then, as shown in FIG. 4B, the interlayer insulating layer 90 comprising TEOS-SiO and being 400 nm-thick is deposited on the interlayer insulating layer 80 including the variable resistance element 100, by, for example, a CVD method, to extend the interlayer insulating layer 80 in an upward direction. Further, a second wire trench 21 is formed in the interlayer insulating layer 90. In the present embodiment, the second wire trenches 21 are formed to make up a stripe shape to cross the first wires 10, respectively. For example, a width of the second wire trench 21 may be set to 250 nm, and an interval between the second wires may be set to 250 nm. In the present embodiment, the second wire trench 21 is formed only on an upper side of the variable resistance element 100 but is not formed on an upper side of the dummy hole 111. In other words, the second wire trench 21 is not formed above the dummy hole 111, and therefore, the second wire 20 is not placed above the dummy hole 111. This configuration is intended to prevent the variable resistance layer formed inside the dummy hole 111 from having a stray capacity. If a problem associated with the stray capacity is not so severe, the second wire trench 21 may be formed on the upper side of the dummy hole 111.

Figure 4C:
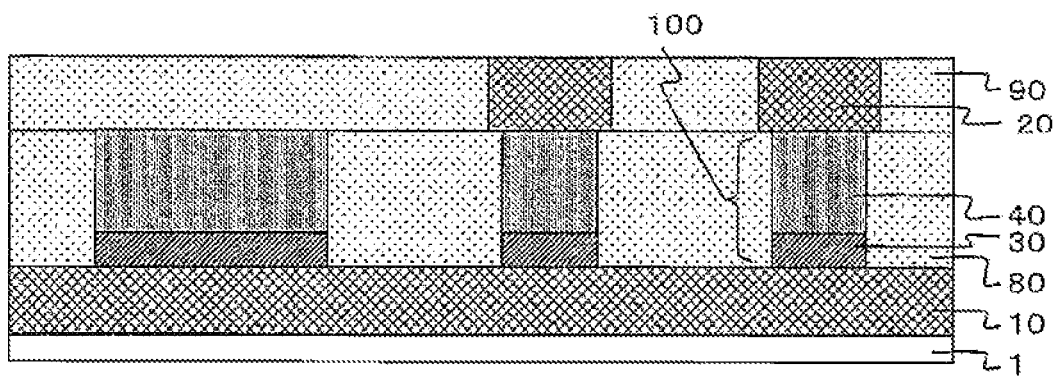
FIG. 4C is a cross-sectional view showing the step of filling a second wire into the second wire trench.

Then, as shown in FIG. 4C, the second wire 20 is formed. Although the Cu wire formed by general damascene process is used as the second wire 20 in the present embodiment, an aluminum (Al) wire formed by a general method may be used.

Through the above process steps, the non-volatile semiconductor memory device can be manufactured by the manufacturing method of the present embodiment.

(Embodiment 2)

A non-volatile semiconductor memory device of Embodiment 2 is configured in such a manner that the non-volatile semiconductor memory device of Embodiment 1 further includes a diode element connected in series with a stacked-layer structure between the stacked-layer structure and a second wire.

[Configuration of Device]

Figure 5A:
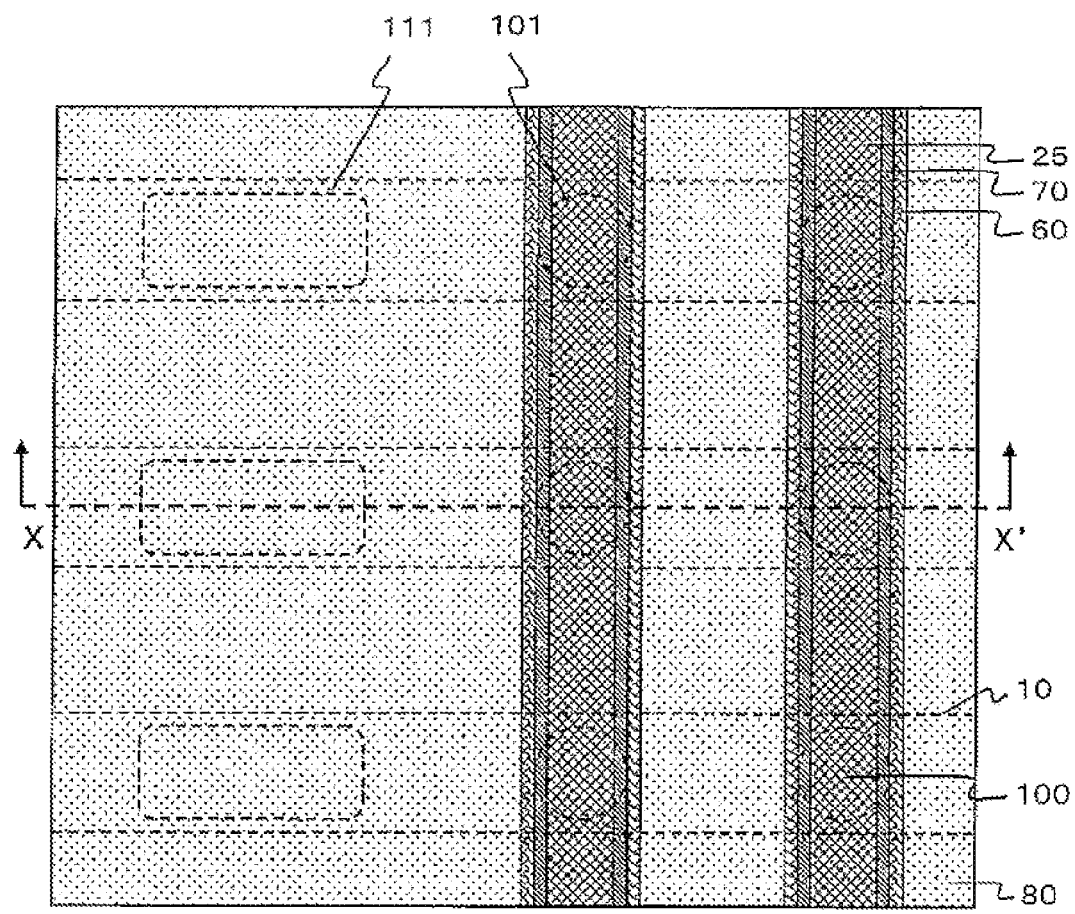
FIG. 5A is a plan view showing a configuration of a non-volatile semiconductor memory device according to Embodiment 2.

FIG. 5A is a plan view showing an exemplary configuration of a non-volatile semiconductor memory device according to Embodiment 2 of the present invention.

The non-volatile semiconductor memory device of the present embodiment has basically the same configuration as that of the non-volatile semiconductor memory device of Embodiment 1. As the electrode and the variable resistance layer constituting the variable resistance element, the same constituents as those of the non-volatile semiconductor memory device of Embodiment 1 can be used. A difference from the non-volatile semiconductor memory device of Embodiment 1 is such that the non-volatile semiconductor memory device of the present embodiment includes a diode element 120 connected in series with the variable resistance element 102, and a second electrode 50 is placed inside the memory cell hole 101.

As the diode element 120, an element having a non-linear switching characteristic may be used according to a resistance changing characteristic of a memory section. The element is, for example, an MSM diode composed of three layers, i.e., a semiconductor layer 60, the second electrode 50 and a third electrode 70 which are stacked together such that the semiconductor layer 60 is sandwiched between the second electrode 50 and the third electrode 70, an MIM diode including an insulator layer instead of the semiconductor layer 60, a pn-junction diode composed of two layers, i.e., a p-type semiconductor and a n-type semiconductor which are stacked together, or a Schottky diode composed of two layers, i.e., a semiconductor layer and a metal electrode layer which are stacked together.

In the case of the cross-point ReRAM, the connection of the diode element in series with the variable resistance element can lessen a cross talk between a selected variable resistance layer at a cross-point of the first wire 10 and the second wire 25 and an unselected variable resistance layer at a cross-point of the first wire 10 and the second wire 25, when a resistance value is written to or read from the selected variable resistance layer.

Figure 5B:
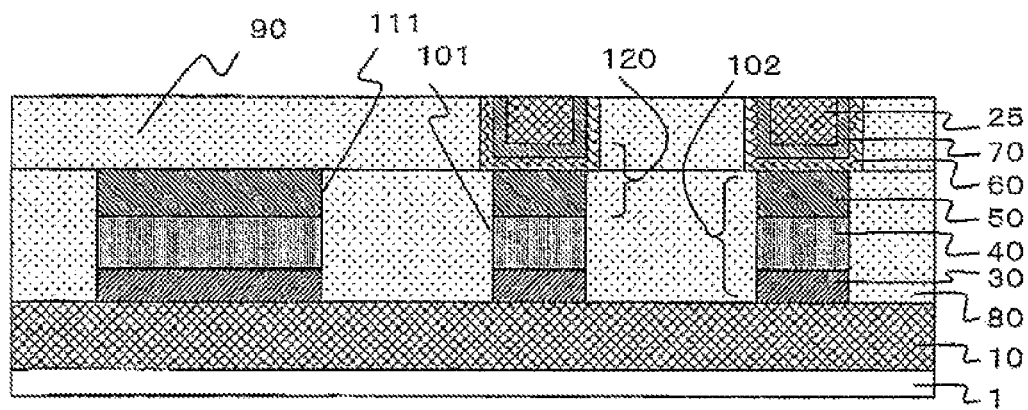
FIG. 5B is a cross-sectional view taken in the direction of arrows along X-X' in FIG. 5A.

FIG. 5B is a cross-sectional view taken in the direction of arrows along line X-X' in FIG. 5A.

As shown in FIGS. 5A and 5B, the variable resistance element 102 of the present embodiment includes the first electrode 30, the variable resistance layer 40 and the second electrode 50 which are formed in this order on the upper surface of the first wire 10, in an upward direction perpendicular to the substrate. Furthermore, the semiconductor layer 60, the third electrode 70, and the second wire 25 are formed in this order on the variable resistance element 102.

The stacked-layer structure of the second electrode 50, the semiconductor layer 60 and the third electrode 70 constitute the diode element 120 having a metal-semiconductor-metal (MSM) structure.

By using the above stated configuration of the present embodiment, an operation similar to that of Embodiment 1 can be implemented, and beneficial effects similar to those of Embodiment 1 can be achieved. That is, a bit failure attributed to non-uniformity in thicknesses of the lower electrodes of the variable resistance elements can be solved, non-uniformity in thicknesses of plated layers formed in the bottom portions of the memory cell holes in the cross-point memory array can be lessened, and an increase in non-uniformity in the thicknesses of plated layers in miniaturized memory cell holes can be lessened. Moreover, by placing the diode element on each of the variable resistance elements and under the second wire, it is possible to implement a cross-point non-volatile semiconductor memory device incorporating the diode elements, which can implement miniaturization and suppress a leak current from an unselected element.

[Manufacturing Method]

Next, the manufacturing method of the non-volatile semiconductor memory device of Embodiment 1 will be described with reference to FIGS. 6A~6C, FIGS. 7A~7C, and FIGS. 8A~8C. FIGS. 6A~6C, 7A~7C, and 8A~8C are cross-sectional views showing the process steps performed to form the constituents shown in FIG. 5B.

Figure 6A:
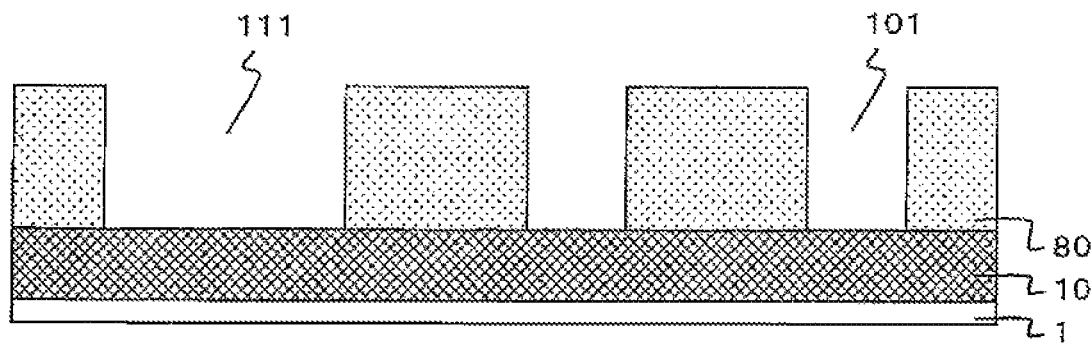
FIG. 6A is a cross-sectional view showing the step of forming on the substrate, the first wire and the interlayer insulating layer provided with the hole reaching the first wire, in a manufacturing method of a non-volatile semiconductor memory device according to Embodiment 2.

Initially, as shown in FIG. 6A, the first wire 10 is formed on the substrate 1. Although in the present embodiment, a Cu wire formed by damascene process is used as the first wire 10, an aluminum (Al) wire formed in a general process may be used. For example, a width of the first wire may be set to 250 nm, and an interval between the first wires may be set to 250 nm.

Then, the interlayer insulating layer 80 comprising TEOS-SiO, or the like and being 200 nm-thick is deposited by, for example, CVD method. As the interlayer insulating layer 80, a silicon oxide ($SiO_2$) deposited by the CVD method, a TEOS-SiO layer deposited using ozone ($O_3$) and tetraethoxysilane (TEOS) by CVD method, a silicon oxycarbite (SiOC) layer which is a low dielectric constant material, a fluorinated silicon oxide (SiOF) layer which is a low dielectric constant material, etc. may be used.

To easily form the hole in the interlayer insulating layer 80, a plurality of interlayer insulating layers may be formed in such a manner that a lower layer of the interlayer insulating layer 80 is formed using a material having etching resistance to dry etching using fluorinated etching gas, to be specific, a silicon nitride (SiN) layer deposited by CVD method, a silicon oxynitride (SiON) layer deposited by CVD method, a silicon carbon nitride (SiCN) layer deposited by CVD method, etc., and an upper layer of the interlayer insulating layer 80 is formed using an insulative oxide material other than SiN and SiON.

Then, the memory cell hole 101 and the dummy hole 111 are formed through the interlayer insulating layer 80 such that the memory cell hole 101 and the dummy hole 111 reach the upper surface of the first wire 10. A diameter of the memory cell hole 101 may be set to, for example, 200 nm. A surface area of a portion of the first wire 10 which is exposed on a bottom of the dummy hole 111 is greater than a surface area of a portion of the first wire 10 which is exposed in a bottom of the memory cell hole 101. In the present embodiment, the dummy hole 111 may have a planar shape of, for example, a rectangle-like shape having rounded corners with a short-side length of 200 nm, and a long-side length of 400 nm. A long-side direction of the dummy hole 111 suitably conforms to a long-side direction of the first wire 10.

Figure 6B:
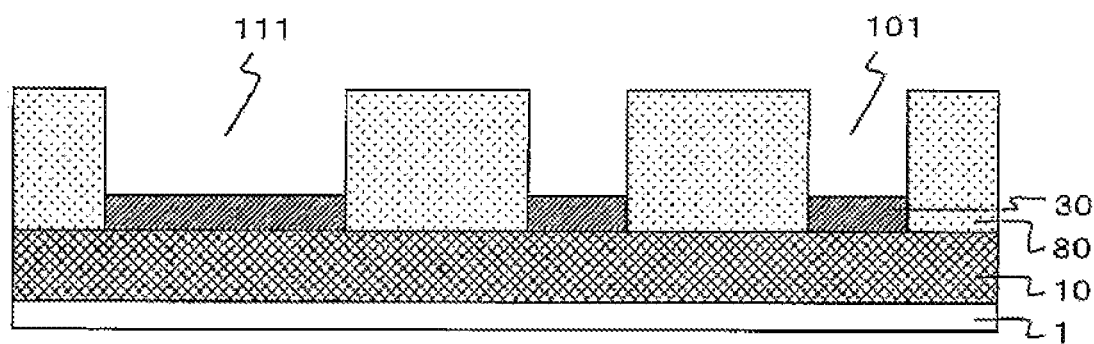
FIG. 6B is a cross-sectional view showing the step of forming the first electrode in the bottom of the hole, in the manufacturing method of the non-volatile semiconductor memory device according to Embodiment 2.

Then, as shown in FIG. 6B, the first electrode 30 is deposited by plating for selectively growing the electrode material only in a bottom of the memory cell hole 101 and only in a bottom of the dummy hole 111. In the present embodiment, the first electrode 30 is deposited by using electroless selective growth plating of platinum (Pt) which is an electrode material which allows $TaO_x$ to exhibit a good resistance changing characteristic. As electroless Pt plating solution, hydrazine-ammonia Pt plating solution, Pt plating solution containing as a reducing agent boron compound or hypophosphorous acid, etc., may be used. Although the thickness of the Pt electrode layer is 5 nm, it may be set to not less than 5 nm and not more than 24 nm. By thinning the Pt electrode layer in this way, formation of hillocks of Pt due to thermal treatment can be suppressed and an interface between the Pt electrode layer and the variable resistance layer can be planarized. By conducting the above electroless Pt plating after forming a seed layer comprising one of nickel, nickel-phosphorus alloy, or nickel-boron alloy, on the lower Cu wire exposed in the bottom of the memory cell hole 101 and in the bottom of the dummy hole 111, Pt can be selectively grown on Cu more efficiently. Alternatively, the seed layer may have a stacked-layer structure of a combination of palladium and nickel, a combination of palladium and nickel-phosphorus alloy, or a combination of palladium and nickel-boron alloy.

Figure 6C:
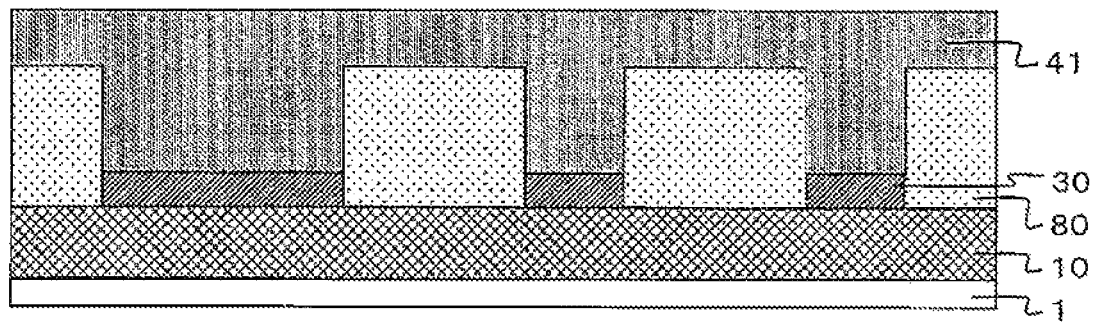
FIG. 6C is a cross-sectional view showing the step of forming a variable resistance material layer on the interlayer insulating layer and the first electrode, in the manufacturing method of the non-volatile semiconductor memory device according to Embodiment 2.

Then, as shown in FIG. 6C, the variable resistance material layer 41 which will become the variable resistance layer 40 is formed on the interlayer insulating layer 80 including the memory cell hole 101 and the dummy hole 111. In the present embodiment, as the variable resistance material layer 41, for example, an oxygen-deficient tantalum oxide ($TaO_x$) may be deposited by sputtering. A suitable range of $TaO_x$ is preferably $0.8 \leq x \leq 1.9$. Instead of the tantalum oxide, a hafnium oxide or a zirconium oxide may be used. When the hafnium oxide is expressed as $HfO_x$, $0.9 \leq x \leq 1.6$ is preferable. When the zirconium oxide is expressed as $ZrO_x$, $0.9 \leq x \leq 1.4$ is preferable. By adjusting a ratio of an oxygen gas flow rate with respect to an argon gas flow rate during sputtering, the value of x in chemical formulas of $TaO_x$, $HfO_x$, and $ZrO_x$ can be adjusted.

As a deposition method, CVD method, ALD method, or the like may be used instead of the sputtering method. Alternatively, after a metal Ta layer, a metal Hf layer, or a metal Zr layer is deposited, the metal Ta layer, the metal Hf layer, or the metal Zr layer may be oxidized to form $TaO_x$, $HfO_x$, or $ZrO_x$. A thickness of the variable resistance material layer 41 which allows the memory cell hole 101 to be embedded therein is sufficient, and may be set to, for example, 400 nm in the present embodiment so that the step of removing an upper portion of the variable resistance material layer 41 is performed easily later.

Figure 7A:
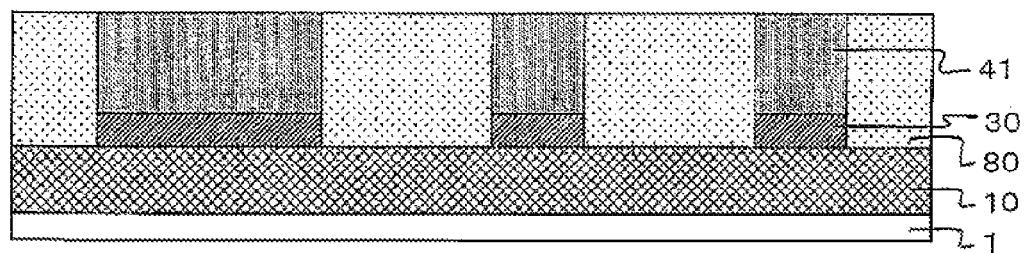
FIG. 7A is a cross-sectional view showing the step of removing a portion of the variable resistance material layer on the interlayer insulating layer, in the manufacturing method of the non-volatile semiconductor memory device according to Embodiment 2.

Then, as shown in FIG. 7A, a portion of the variable resistance material layer 41 on the interlayer insulating layer 80 is removed by CMP method, thereby leaving the variable resistance material layer 41 only in the memory cell hole 101 and in the dummy hole 111. The portion of the variable resistance material layer 41 on the interlayer insulating layer 80 may be removed by etch-back process instead of CMP.

Figure 7B:
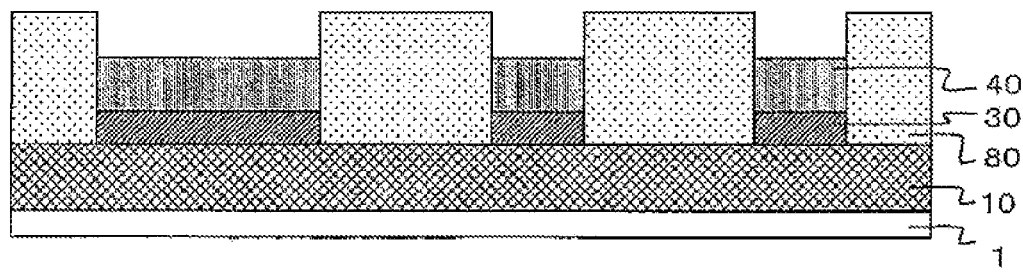
FIG. 7B is a cross-sectional view showing the step of removing an upper portion of the variable resistance material layer to form the variable resistance layer, in the manufacturing method of the non-volatile semiconductor memory device according to Embodiment 2.

Then, as shown in FIG. 7B, by overpolishing, an upper portion of the variable resistance material layer 41 in the memory cell hole 101 and an upper portion of the variable resistance material layer 41 in the dummy hole 111 are removed. Thus, the variable resistance layer 40 is formed inside each of the memory cell hole 101 and the dummy hole 111. The upper portion of the variable resistance material layer 41 may be removed by etch-back process instead of overpolishing. In the present Embodiment, the thickness of the upper portion of the variable resistance material layer 41 which is removed by overpolishing may be set to about 30 nm.

Figure 7C:
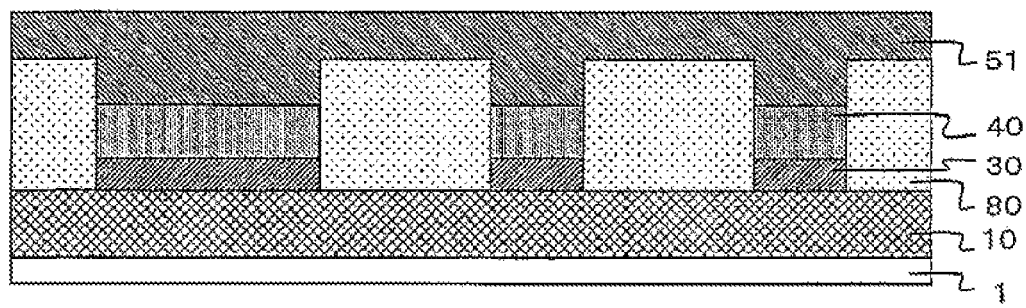
FIG. 7C is a cross-sectional view showing the step of forming a second electrode material layer on the interlayer insulating layer and the variable resistance layer, in the manufacturing method of the non-volatile semiconductor memory device according to Embodiment 2.

Then, as shown in FIG. 7C, a second electrode material layer 51 which will become the second electrode 50 of the variable resistance element 102 is formed on the interlayer insulating layer 80 including the memory cell hole 101 and the dummy hole 111. In the present embodiment, for example, TaN, TiN or W of 100 nm may be deposited as the second electrode material layer 51, by sputtering.

Figure 8A:
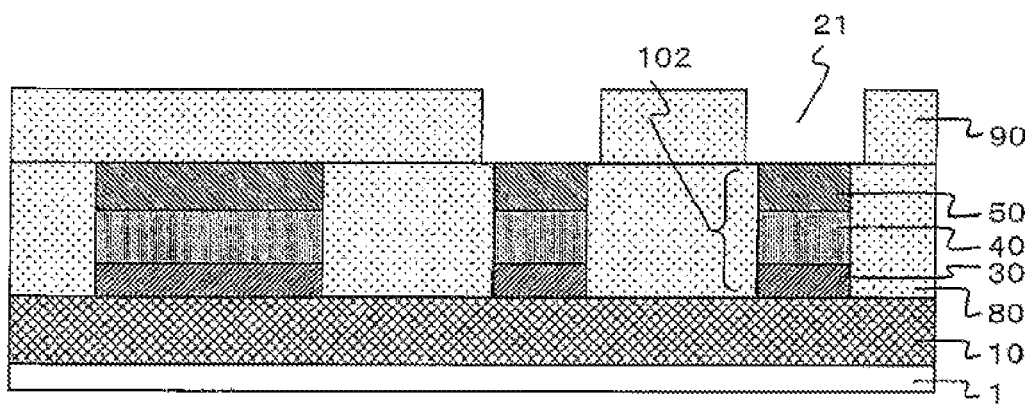
FIG. 8A is a cross-sectional view showing the step of a removing a portion of the second electrode material layer on the interlayer insulating layer to form the second electrode, and forming the interlayer insulating layer provided with the second wire trench, on the interlayer insulating layer and on the second electrode, in the manufacturing method of the non-volatile semiconductor memory device according to Embodiment 2.

Then, as shown in FIG. 8A, a portion of the second electrode material layer 51 on the interlayer insulating layer 80 is removed by CMP, thereby leaving the second electrode 50 in each of the memory cell hole 101 and the dummy hole 111 such that the second electrode 50 is filled in each of the memory cell hole 101 and the dummy hole 111. Then, the interlayer insulating layer 90 comprising TEOS-SiO and being 400 nm-thick is deposited on the interlayer insulating layer 80 including the second electrode 50, using, for example, CVD method. Further, the second wire trench 21 is formed in the interlayer insulating layer 90. In the present embodiment, the second wire trenches 21 are formed to make up a stripe shape to cross the first wires 10, respectively, so that the semiconductor layers 60, the third electrodes 70 and the second wires 25 are formed to make up a stripe shape to cross the first wires 10, respectively. For example, a width of the second wire trench 21 may be set to 250 nm, and an interval between the second wires may be set to 250 nm. Although in the present embodiment, the second wire trench 21 is formed only on the upper side of the variable resistance element 102, but is not formed on the upper side of the dummy hole 111, the second wire trench 21 may also be formed on the upper side of the dummy hole 111.

Figure 8B:
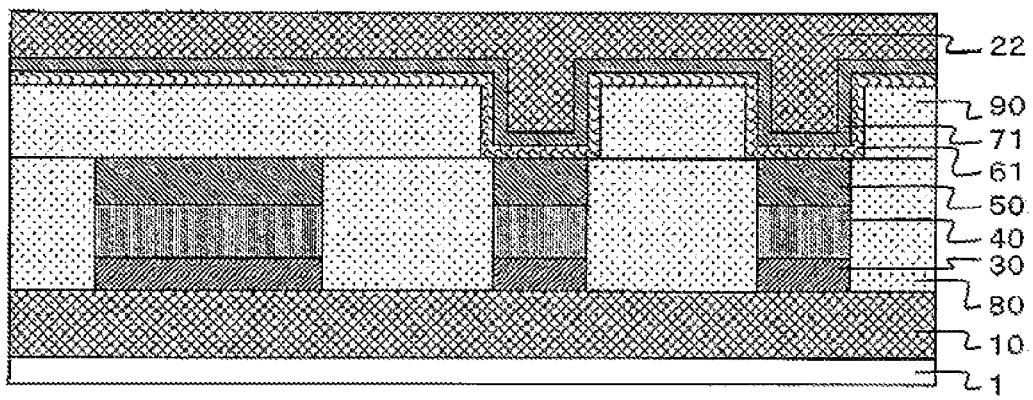
FIG. 8B is a cross-sectional view showing the step of depositing a semiconductor material layer, a third electrode material layer and a second wire material layer in this order on the interlayer insulating layer and on the second electrode, in the manufacturing method of the non-volatile semiconductor memory device according to Embodiment 2.

Then, as shown in FIG. 8B, a semiconductor material layer 61, a third electrode material layer 71, and a second wire material layer 22 are stacked on the interlayer insulating layer 90 including the second wire trench 21.

Figure 8C:
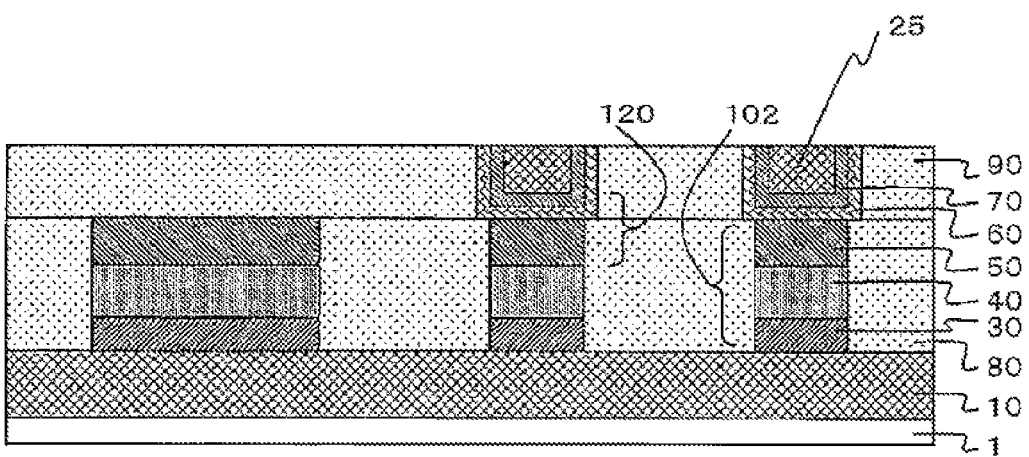
FIG. 8C is a cross-sectional view showing the step of removing a portion of the semiconductor material layer, a portion of the third electrode material layer and a portion of the second wire material layer which are on the interlayer insulating layer, to form a semiconductor layer, a third electrode, and a second wire, in the manufacturing method of the non-volatile semiconductor memory device according to Embodiment 2.

Then, as shown in FIG. 8C, a portion of the semiconductor material layer 61, a portion of the third electrode material layer 71, and a portion of the second wire material layer 22, which are formed on the second electrode 50 and the interlayer insulating layers 80 and 90, are removed by CMP, thereby leaving the semiconductor layer 60 of the diode element 120, the third electrode 70 of the diode element 120, and the second wire 25 in the second wire trench 21 such that the second wire trench 21 is filled with the semiconductor layer 60, the third electrode 70, and the second wire 25.

In the present embodiment, the MSM diode is formed to include the semiconductor layer 60, the second electrode 50 and the third electrode 70 such that the semiconductor layer 60 is sandwiched between the second electrode 50 and the third electrode 70 by using a nitrogen-deficient silicon nitride ($SiN_z$, $0 < z \leq 0.85$) as the semiconductor layer 60, and TaN, TiN or W as the second electrode 50. The $SiN_z$ layer having such a semiconductive property can be deposited by reactive sputtering in a nitrogen gas atmosphere using, for example, an Si target. For example, the $SiN_z$ layer can be formed under conditions of a room temperature, a chamber pressure of 0.1 Pa~1 Pa, and an $Ar/N_2$ flow rate of 18 sccm/2 sccm.

When $SiN_z$ having a semiconductive property is deposited such that Z is 0.3 and it is 10 nm-thick, a current density of $1 \times 10^4$ $A/cm^2$ is obtained by applying a voltage of 1.6 V, while a current density of $1 \times 10^3$ $A/cm^2$ is obtained by applying a voltage of 0.8 V. When these voltages are used as a reference, an ON/OFF ratio is 10. Thus, it is confirmed that a diode element including such $SiN_z$ can be used satisfactorily as a diode element of a non-volatile semiconductor memory device.

The second wire 25 may be formed of the same material as that of the first wire 10.

In the present embodiment, for example, the thickness of the semiconductor material layer 61, the thickness of the third electrode material layer 71, and the thickness of the second wire layer may be set to 16 nm, 20 nm, and 400 nm, respectively.

Through the above steps, it is possible to manufacture the non-volatile semiconductor memory device by the manufacturing method of the present embodiment.

(Embodiment 3)

A non-volatile semiconductor memory device of Embodiment 3 is configured such that the variable resistance layer includes a first variable resistance layer and a second variable resistance layer, the first variable resistance layer and the second variable resistance layer comprise metal oxides of the same kind, respectively, and the first variable resistance layer has a higher oxygen content than the second variable resistance layer, in at least one of the non-volatile semiconductor memory device of Embodiment 1 and the non-volatile semiconductor memory device of Embodiment 2.

In a manufacturing method of the non-volatile semiconductor memory device of Embodiment 3, a step (E) includes the step of forming the first variable resistance layer and the second variable resistance layer such that first variable resistance layer and the second variable resistance layer comprise metal oxides of the same kind, respectively, and the first variable resistance layer has a higher oxygen content than the second variable resistance layer, in at least one of the manufacturing method of the non-volatile semiconductor memory device of Embodiment 1 and the manufacturing method of the non-volatile semiconductor memory device of Embodiment 2.

As used herein, the wordings "metal oxides of the same kind" mean that the metal element contained in metal oxides is the same.

[Device Configuration]

Figure 9A:
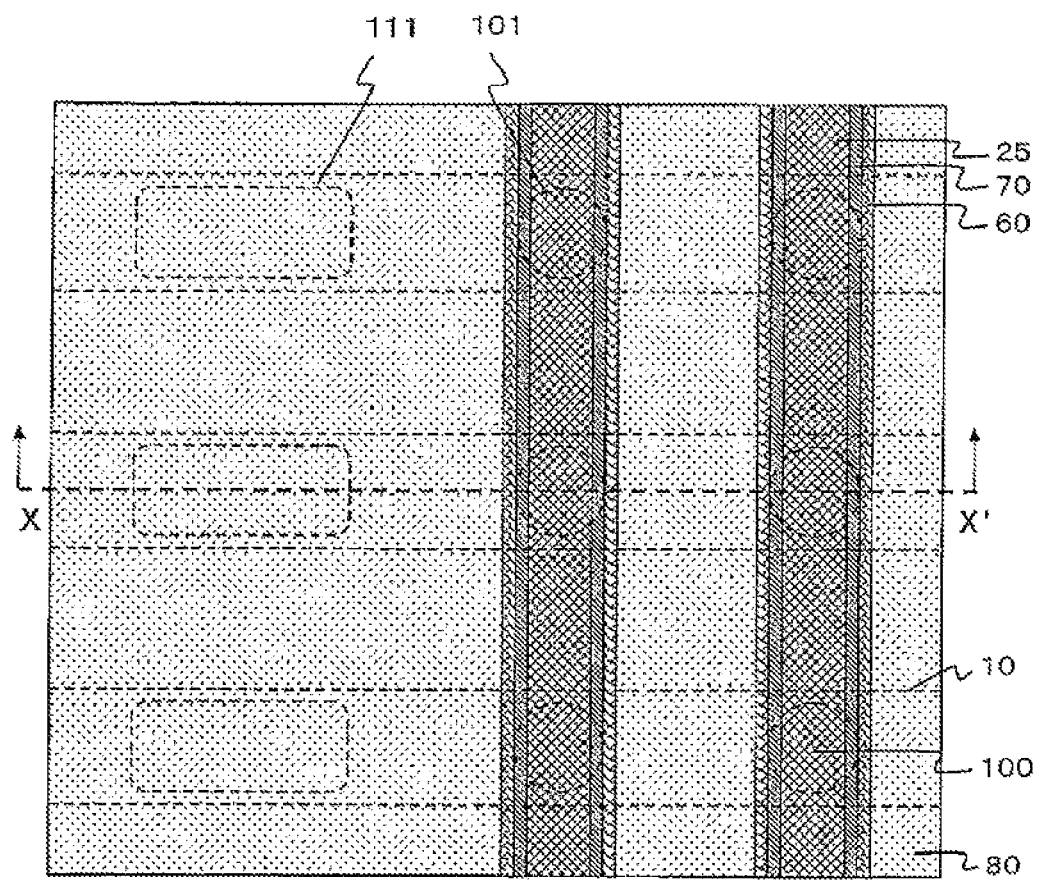
FIG. 9A is a plan view showing a configuration of a non-volatile semiconductor memory device according to Embodiment 3.

FIG. 9A is a plan view showing an exemplary configuration of the non-volatile semiconductor memory device according to Embodiment 3 of the present invention.

In the present embodiment, the non-volatile semiconductor memory device has the same configuration as that of the non-volatile semiconductor memory device of Embodiment 2 except that the variable resistance layer comprises a plurality of layers. Therefore, the same constituents as those of Embodiment 2 are identified by the same reference symbols and names, and repetitive description of them will not be given.

Figure 9B:
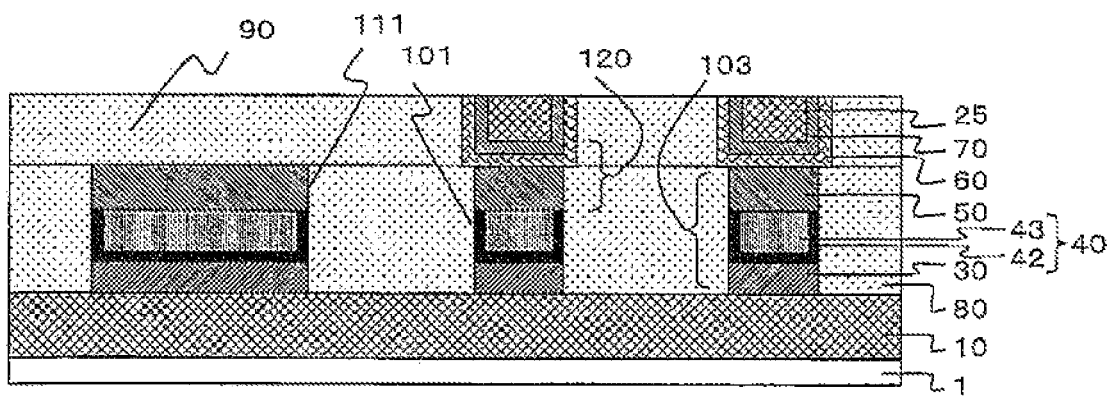
FIG. 9B is a cross-sectional view taken in the direction of arrows along X-X' in FIG. 5A.

FIG. 9B is a cross-sectional view taken in the directions of arrows along X-X' in FIG. 9A.

As shown in FIGS. 9A and 9B, in a variable resistance element 103 of the present embodiment, the variable resistance layer 40 includes a first variable resistance layer 42 and a second variable resistance layer 43. In the example of FIG. 9B, the first variable resistance layer 42 has a cup-shape covering the upper surface of the first electrode 30 and the side surface of the memory cell hole. In the example of FIG. 9B, the second variable resistance layer 43 is filled inside the cup shape defined by the first variable resistance layer 42.

The first variable resistance layer 42 and the second variable resistance layer 43 comprise the metal oxides of the same kind, respectively. The first variable resistance layer 42 has a higher oxygen content than the second variable resistance layer 43. The first variable resistance layer 42 becomes a higher-resistance layer, while the second variable resistance layer 43 becomes a lower-resistance layer.

In accordance with such a configuration, the first variable resistance layer 42 having a higher oxygen content is placed in a bottom portion of the memory cell hole 101 such that the first variable resistance layer 42 is connected to the first electrode 30, and the second variable resistance layer 43 having a lower oxygen content is placed on the first variable resistance layer 42, thereby allowing resistance change to take place surely in an interface region between the first variable resistance layer 42 and the first electrode 30. As a result, a polarity of an electric pulse to be applied to allow the variable resistance layer 40 to change its resistance (attain a higher-resistance state or a lower-resistance state) is decided uniquely. Thus, a stable operation characteristic of a memory device is attainable.

A resistance changing operation takes place by redox in a region of the variable resistance layer 40 in the vicinity of the electrode. By placing the first variable resistance layer 42 containing a greater amount of oxygen used for the redox in the region in the vicinity of the interface between the variable resistance layer 40 and the first electrode 30, a stable resistance changing operation can be implemented. Although, the first variable resistance layer 42 is also formed on the side wall of the memory cell hole 101 as depicted in FIGS. 9A and 9B, it is sufficient that the first variable resistance layer 42 is formed on at least a portion (bottom portion of the memory cell hole 101) of the memory cell hole 101 which contacts the first electrode 30.

By using the above stated configuration of the present embodiment, an operation similar to that of Embodiment 2 is implemented, and beneficial effects similar to those of Embodiment 2 can be achieved. To be specific, it is possible to prevent a bit failure attributed to non-uniformity in thicknesses of lower electrodes of variable resistance elements, and it is possible to lessen non-uniformity in thicknesses of plated layers formed in bottom portions of memory cell holes in the cross-point memory array. In addition, it is possible to suppress an increase in non-uniformity of thicknesses of plated layers formed in bottom portions of miniaturized memory cell holes. By placing the diode element on each variable resistance layer and below the second wire, it is possible to implement a cross-point non-volatile semiconductor memory device incorporating the diode elements, which can implement miniaturization and can suppress a leak current from an unselected element.

In the present embodiment, the variable resistance layer comprises the first variable resistance layer and the second variable resistance layer. By making the thicknesses of the first electrodes uniform, the first variable resistance layers are made uniform in thicknesses and the second variable resistance layers are made uniform in thickness. Therefore, in the case of forming the variable resistance elements each including two variable resistance layers, in the memory cell holes, it is possible to suppress non-uniformity in electric characteristics of the element such as, initial resistances, voltages and currents which cause the resistance changing operation to occur, changing magnitudes of resistance values, etc. Moreover, reliability (retention and endurance) of the elements is improved.

[Manufacturing Method]

Next, a manufacturing method of the non-volatile semiconductor memory device of Embodiment 1 will be described with reference to FIGS. 10A~10C, FIGS. 11A~11C, and FIGS. 12A~12C. FIGS. 10A~10C, FIGS. 11A~11C, and FIGS. 12A~12C are cross-sectional views showing the process steps of forming the constituents of FIG. 9B.

Figure 10A:
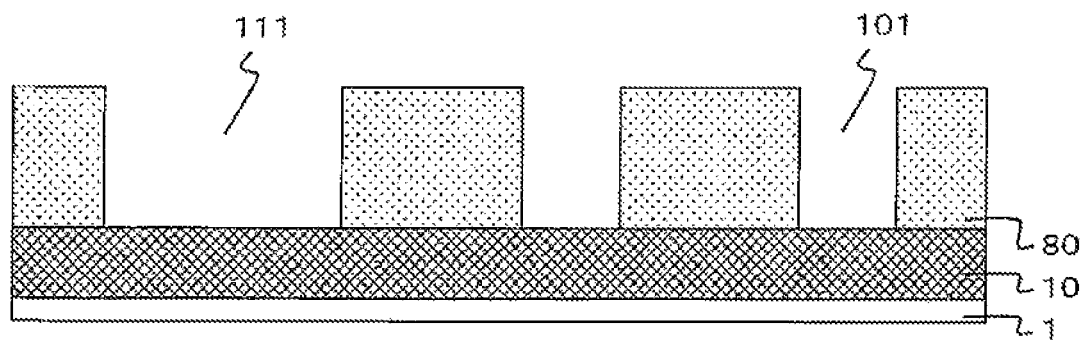
FIG. 10A is a cross-sectional view showing the step of forming the first wire on the substrate and the interlayer insulating layer provided with the hole reaching the first wire, in a manufacturing method of a non-volatile semiconductor memory device according to Embodiment 3.
Figure 10B:
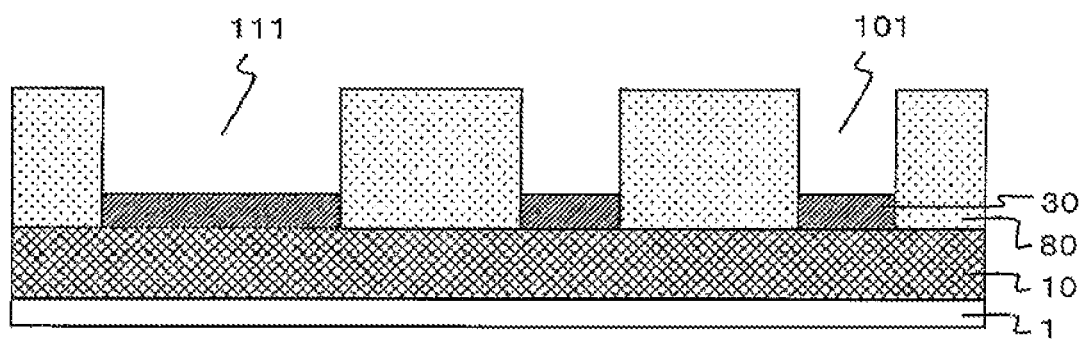
FIG. 10B is a cross-sectional view showing the step of forming the first electrode in the bottom of the hole, in the manufacturing method of the non-volatile semiconductor memory device according to Embodiment 3.

The process step of FIG. 10A and the process step of FIG. 10B are similar to that of FIG. 6A and that of FIG. 6B of Embodiment 2, respectively, and detailed description thereof will not be given.

Figure 10C:
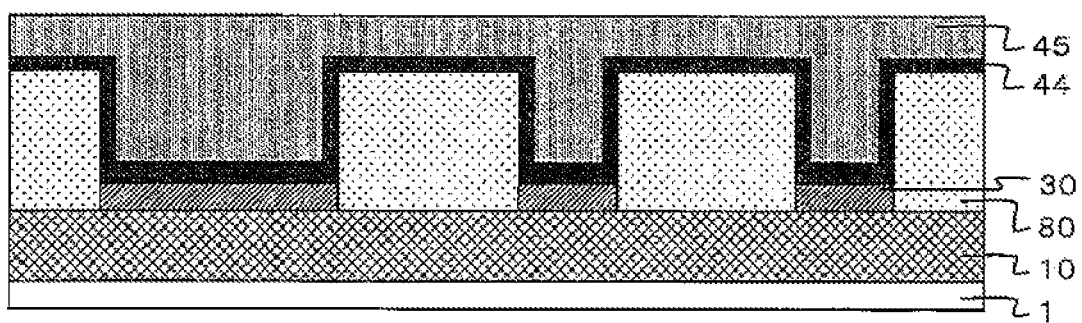
FIG. 10C is a cross-sectional view showing the step of forming a first variable resistance material layer and a second variable resistance material layer in this order on the interlayer insulating layer and on the first electrode, in the manufacturing method of the non-volatile semiconductor memory device according to Embodiment 3.

After the process step of FIG. 10B, as shown in FIG. 10C, a first variable resistance material layer 44 which will become the first variable resistance layer 42 is formed on the interlayer insulating layer 80 including the memory cell hole 101 and the dummy hole 111, and further, a second variable resistance material layer 45 which will become the second variable resistance layer 43 is formed on the first variable resistance material layer 44.

In the present embodiment, as the first variable resistance material layer 44, for example, an oxygen-deficient tantalum oxide ($TaO_y$) may be deposited by, for example, sputtering method. A suitable range of $TaO_y$ is preferably $2.1 \leq y$. The tantalum oxide may be replaced by a hafnium oxide or a zirconium oxide. When the hafnium oxide is expressed as $HfO_y$, $1.8 < y$ is preferable. When the zirconium oxide is expressed as $ZrO_y$, $1.9 < y$ is preferable. By adjusting a ratio of an oxygen gas flow rate with respect to an argon gas flow rate during sputtering, the value of y in chemical formulas of $TaO_y$, $HfO_y$, and $ZrO_y$ can be adjusted.

In the present embodiment, as the second variable resistance material layer 45, for example, an oxygen-deficient tantalum oxide ($TaO_x$) may be deposited by sputtering. A suitable range of $TaO_x$ is preferably $0.8 \leq x \leq 1.9$. Instead of the tantalum oxide, a hafnium oxide or a zirconium oxide may be used. When the hafnium oxide is expressed as $HfO_x$, $0.9 \leq x \leq 1.6$ is preferable. When the zirconium oxide is expressed as $ZrO_x$, $0.9 \leq x \leq 1.4$ is preferable. By adjusting a ratio of an oxygen gas flow rate with respect to an argon gas flow rate during sputtering, the value of x in chemical formulas of $TaO_x$, $HfO_x$, and $ZrO_x$ can be adjusted. The thickness of the first variable resistance material layer 44 is preferably smaller than the thickness of the second variable resistance material layer 45. To be specific, for example, in a case where transition metal constituting the variable resistance material layer is Ta, the thickness of the first variable resistance material layer 44 is preferably not less than 1 nm and not more than 8 nm, and the thickness of the second variable resistance material layer 45 is preferably not less than 10 nm and not more than 100 nm. In a case where transition metal constituting the variable resistance material layer is Hf, the thickness of the first variable resistance material layer 44 is preferably not less than 4 nm and not more than 5 nm and the thickness of the second variable resistance material layer 45 is preferably not less than 10 nm and not more than 100 nm. In a case where transition metal constituting the variable resistance material layer is Zr, the thickness of the first variable resistance material layer 44 is preferably not less than 1 nm and not more than 5 nm, and the thickness of the second variable resistance material layer 45 is preferably not less than 10 nm and not more than 100 nm.

As a deposition method, CVD method, ALD method, or the like may be used instead of the sputtering method. Alternatively, after a metal Ta layer, a metal Hf layer, or a metal Zr layer is deposited, the metal Ta layer, the metal Hf layer or the metal Zr layer may be oxidized to form $TaO_x$, $HfO_x$, or $ZrO_x$, respectively. Or, after the metal Ta layer, the metal Hf layer, or the metal Zr layer is deposited, the metal Ta layer, the metal Hf layer or the metal Zr layer may be oxidized to form $TaO_y$, $HfO_y$, or $ZrO_y$, respectively. It is sufficient that a sum of the thickness of the first variable resistance material layer 44 and the thickness of the second variable resistance material layer 45 is not less than a thickness which allows the memory cell hole 101 to be filled up with these layers. In the present embodiment, the sum may be, for example, 400 nm so that the step of removing an upper portion of the first variable resistance material layer 44 and an upper portion of the second variable resistance material layer 45 is performed easily later.

Figure 11A:
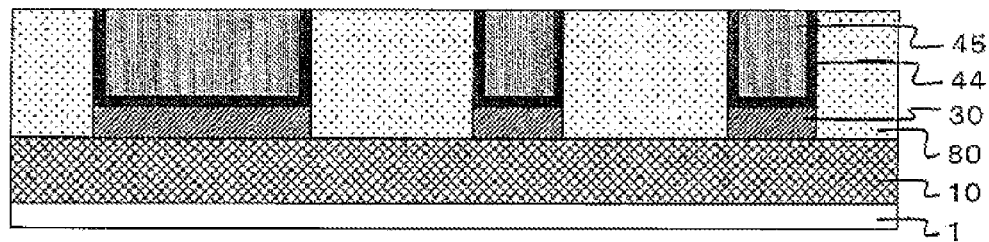
FIG. 11A is a cross-sectional view showing the step of removing a portion of the first variable resistance material layer on the interlayer insulating layer to form a first variable resistance material layer and removing a portion of the second variable resistance material layer which are on the interlayer insulating layer, to form a second variable resistance material layer, in the manufacturing method of the non-volatile semiconductor memory device according to Embodiment 3.

Then, as shown in FIG. 11A, a portion of the first variable resistance material layer 44 and a portion of the second variable resistance material layer 45 on the interlayer insulating layer 80 are removed by CMP, thereby leaving the first variable resistance material layer 44 and the second variable resistance material layer 45 only in the memory cell hole 101 and only in the dummy hole 111. The portion of the variable resistance material layer on the interlayer insulating layer 80 may be removed by etch-back process instead of CMP.

Figure 11B:
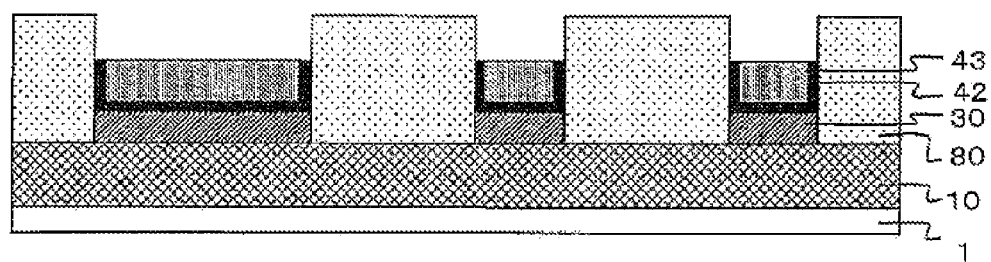
FIG. 11B is a cross-sectional view showing the step of removing an upper portion of the variable resistance material layer to form a first variable resistance layer and a second variable resistance layer, in the manufacturing method of the non-volatile semiconductor memory device according to Embodiment 3.

Then, as shown in FIG. 11B, by overpolishing, the upper portion of the first variable resistance material layer 44 in the memory cell hole 101 and the dummy hole 111 and the upper portion of the second variable resistance material layer 45 in the memory cell hole 101 and the dummy hole 111 are removed. As a result, the first variable resistance layer 42 and the second variable resistance layer 43 are left in the memory cell hole 101 and in the dummy hole 111. The upper portion of the variable resistance material layer may be removed by etch-back process instead of overpolishing. In the present embodiment, the thickness of the upper portion of the first variable resistance layer 42 removed by overpolishing may be set to about 30 nm, and the thickness of the upper portion of the second variable resistance layer 43 removed by overpolishing may be set to about 30 nm.

It is difficult to form a variable resistance layer comprising oxygen which is equal to or greater than that of a stoichiometric composition, using sputtering. However, plasma oxidization allows oxygen to be implanted into grain boundaries, defectiveness, etc., of the tantalum oxide, thereby forming a transition metal oxide layer having a higher oxygen content, which suppresses a leak current effectively. Alternatively, reactive sputtering may be used, in which sputtering is performed in oxygen gas atmosphere using a tantalum oxide target.

Figure 11C:
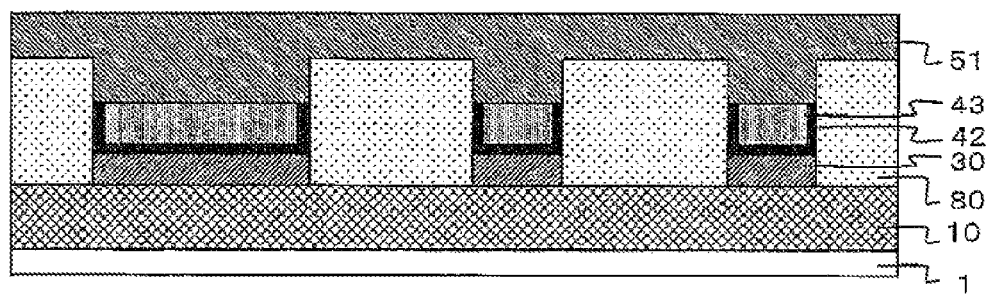
FIG. 11C is a cross-sectional view showing the step of forming the second electrode material layer on the interlayer insulating layer and the variable resistance layer, in the manufacturing method of the non-volatile semiconductor memory device according to Embodiment 3.
Figure 12A:
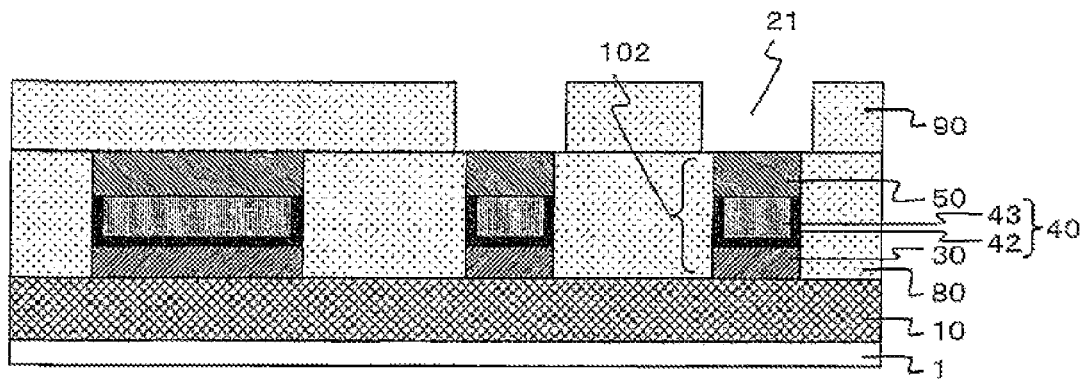
FIG. 12A is a cross-sectional view showing the step of removing a portion of the second electrode material layer on the interlayer insulating layer to form the second electrode, and forming the interlayer insulating layer provided with the second wire trench on the interlayer insulating layer and the second electrode, in the manufacturing method of the non-volatile semiconductor memory device according to Embodiment 3.
Figure 12B:
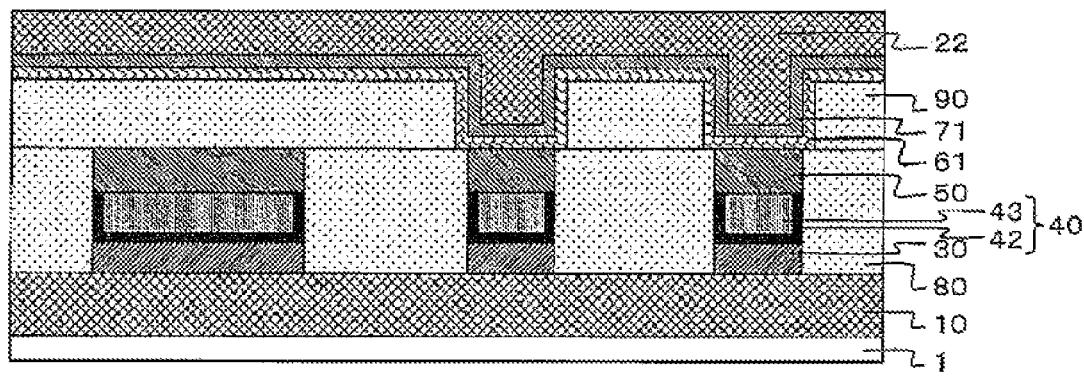
FIG. 12B is a cross-sectional view showing the step of depositing the semiconductor material layer, the third electrode material layer and the second wire material layer in this order on the interlayer insulating layer and on the second electrode, in the manufacturing method of the non-volatile semiconductor memory device according to Embodiment 3.
Figure 12C:
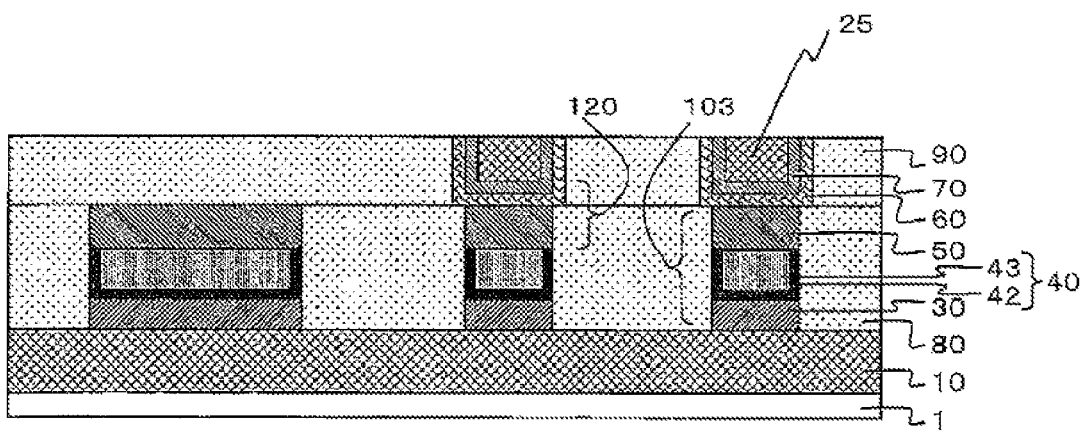
FIG. 12C is a cross-sectional view showing the step of removing a portion of the semiconductor material layer, a portion of the third electrode material layer and a portion of the second wire material layer which are on the interlayer insulating layer, to form the semiconductor layer, the third electrode and the second wire, in the manufacturing method of the non-volatile semiconductor memory device according to Embodiment 3.

Then, as shown in FIG. 11C, a second electrode material layer 51 which will become the second electrode 50 of the variable resistance element 103, is deposited on the interlayer insulating layer 80, the first variable resistance layer 42 exposed in the memory cell hole 101 and the dummy hole 111, and the second variable resistance layer 43 exposed in the memory cell hole 101 and the dummy hole 111. In the present embodiment, as the second electrode material layer 51, for example, TaN, TiN or W of 100 nm may be deposited by sputtering The process steps of FIGS. 12A~12C are identical to the process steps of FIGS. 8A~8C of Embodiment 2, and detailed description thereof is omitted.

Through the above steps, it is possible to manufacture the non-volatile semiconductor memory device by the manufacturing method of the present embodiment.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A non-volatile semiconductor memory device of the present invention has a cross-point structure for attaining miniaturization and a larger capacity, and can solve a problem of non-uniformity associated with manufacturing of miniaturized constituents, which is difficult to realize in the conventional manufacturing method. The non-volatile semiconductor memory device of the present invention has high-speed operability and a stable write and read characteristic. Thus, the non-volatile semiconductor memory device of the present invention is useful as a non-volatile semiconductor memory device incorporated into various electronic devices such as digital home appliances, memory cards, cellular phones and personal computers.

REFERENCE SIGNS LISTS 1 substrate
10 first wire
20 second wire
21 second wire trench
22 second wire material layer
25 second wire
30 first electrode
40 variable resistance layer
41 variable resistance material layer
42 first variable resistance layer
43 second variable resistance layer
44 first variable resistance material layer
45 second variable resistance material layer
50 second electrode
51 second electrode material layer
60 semiconductor layer
61 semiconductor material layer
70 third electrode
71 third electrode material layer
80 interlayer insulating layer
90 interlayer insulating layer
100 variable resistance element
101 memory cell hole
102 variable resistance element
103 variable resistance element
111 dummy hole
120 diode element
200 region
210 conducive line
215 conductive line
220 electrode
225 CMO memory layer
230 electrode
235 metal layer
240 insulating layer
245 metal layer
316 first interlayer insulating layer
318 lower Cu wire
319 second interlayer insulating layer
320 wire trench
326 memory cell hole
330 precious metal electrode layer
331 variable resistance layer
331a variable resistance material layer
332 intermediate electrode
332a intermediate electrode material layer
333 variable resistance element (memory section)
334 semiconductor layer
334a semiconductor material layer
335 upper electrode
335a upper electrode material layer
336 diode element (first diode element)
337 third interlayer insulating layer
338 upper Cu wire (first upper Cu wire)
338a upper Cu wire material layer
339 upper Cu wire trench

The invention claimed is:

1. A non-volatile semiconductor memory device comprising:
a substrate;
a plurality of first wires of a stripe shape which are formed on the substrate;
an interlayer insulating layer formed to cover the plurality of first wires;
a plurality of second wires of a stripe shape which are formed on the interlayer insulating layer such that the plurality of second wires are located above the plurality of first wires and cross the plurality of first wires, respectively;
a plurality of memory cell holes formed at cross-points of the plurality of first wires and the plurality of second wires, respectively, when viewed from above, the memory cell holes being formed through the interlayer insulating layer between the plurality of first wires and the plurality of second wires such that the memory cell holes expose upper surfaces of the plurality of first wires, respectively;
a plurality of dummy holes formed on the plurality of first wires, respectively, in the interlayer insulating layer such that the plurality of dummy holes reach the upper surfaces of the plurality of first wires, respectively; and
stacked-layer structures formed inside the memory cell holes and inside the dummy holes, respectively, each of the stacked-layer structures including a first electrode and a variable resistance layer formed on the first electrode;
an area of a portion of the first wire which is exposed in a lower opening of one of the dummy holes being greater than an area of a portion of the first wire which is exposed in a lower opening of one of the memory cell holes; and
one or more of the dummy holes being formed on each of the first wires.

2. The non-volatile semiconductor memory device according to claim 1, wherein the second wires are not formed above the dummy holes.

3. The non-volatile semiconductor memory device according to claim 1, wherein the dummy holes have a rectangular shape when viewed from above, the memory cell holes have a circular shape when viewed from above, a short-side length of the rectangular shape is equal to or greater than a diameter of the circular shape, and a long-side length of the rectangular shape is greater than the diameter of the circular shape.

4. The non-volatile semiconductor memory device according to claim 1, wherein a side surface of each of the first wires is exposed in a lower opening of corresponding one of the dummy holes.

5. The non-volatile semiconductor memory device according to claim 1, further comprising:
diode elements placed between the stacked-layer structures and the second wires and connected in series with the stacked-layer structures, respectively.

6. The non-volatile semiconductor memory device according to claim 1, wherein the first electrode comprises at least one of platinum, palladium, and a mixture containing at least one of platinum and palladium.

7. The non-volatile semiconductor memory device according to claim 1, comprising:
seed layers placed between the first wires and the first electrodes, respectively;

wherein each of the seed layers comprises at least one of nickel, nickel-phosphorus alloy, and nickel-boron alloy, and the first electrode comprises at least one of platinum and palladium.

8. The non-volatile semiconductor memory device according to claim 1, wherein each of seed layers comprises at least one of a stacked-layer structure of palladium and nickel, a stacked-layer structure of palladium and nickel-phosphorus alloy, and a stacked-layer structure of the palladium and nickel-boron alloy, and the first electrode comprises at least one of platinum and palladium.

9. The non-volatile semiconductor memory device according to claim 1, wherein the variable resistance layer comprises an oxygen-deficient transition metal oxide which is less in oxygen content than an oxide having a stoichiometric composition.

10. The non-volatile semiconductor memory device according to claim 1, wherein the variable resistance layer includes a first variable resistance layer and a second variable resistance layer;
the first variable resistance layer and the second variable resistance layer comprise metal oxides of the same kind, respectively; and
the first variable resistance layer has a higher oxygen content than the second variable resistance layer.

11. A method of manufacturing a non-volatile semiconductor memory device comprising:
a step (A) of forming a plurality of first wires of a stripe shape on a substrate;
a step (B) of forming an interlayer insulating layer on the substrate including the plurality of first wires;
a step (C) of forming, through the interlayer insulating layer, a plurality of memory cell holes and at least one dummy hole such that the memory cell holes and the dummy hole reach upper surfaces of the plurality of first wires, the dummy hole having a greater lower opening area than the memory cell holes;
a step (D) of depositing a first electrode material on the plurality of first wires exposed in lower openings of the memory cell holes and a lower opening of the dummy hole, by electroless selective growth plating, to form first electrodes inside the memory holes, respectively;
a step (E) of filling variable resistance layers inside the plurality of memory cell holes, respectively such that the variable resistance layers are located on the first electrodes, respectively; and
a step (F) of forming a plurality of second wires of a stripe shape on the interlayer insulating layer and on the variable resistance layers filled inside the memory cell holes such that the second wires cross the plurality of first wires, respectively.

12. The method of manufacturing the non-volatile semiconductor memory device according to claim 11, wherein in the step (C), the dummy holes have a rectangular shape when viewed from above, the memory cell holes have a circular shape when viewed from above, a short-side length of the rectangular shape is equal to or greater than a diameter of the circular shape, and a long-side length of the rectangular shape is greater than the diameter of the circular shape.

13. The method of manufacturing the non-volatile semiconductor memory device according to claim 11, comprising: after the step (C) and before the step (D),
a step (G) of depositing seed layers on the first wires, respectively, by electroless selective growth plating;
wherein in the step (D), the first electrode material is deposited on the seed layers.

14. The method of manufacturing the non-volatile semiconductor memory device according to claim 11, comprising: after the step (E) and before the step (F),
a step (H) of forming diode elements on the variable resistance layers, respectively;
wherein in the step (F), the plurality of second wires are formed on the diode elements, respectively.

15. The method of manufacturing the non-volatile semiconductor memory device according to claim 11,
wherein the step (E) includes forming a first variable resistance layer and a second variable resistance layer;
the first variable resistance layer and the second variable resistance layer comprise metal oxides of the same kind, respectively; and
the first variable resistance layer has a higher oxygen content than the second variable resistance layer.

* * * * *